US008227305B2

(12) United States Patent
Forbes

(10) Patent No.: US 8,227,305 B2
(45) Date of Patent: *Jul. 24, 2012

(54) MEMORY ARRAY WITH ULTRA-THIN ETCHED PILLAR SURROUND GATE ACCESS TRANSISTORS AND BURIED DATA/BIT LINES

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/050,819

(22) Filed: Mar. 17, 2011

(65) Prior Publication Data

US 2011/0165744 A1 Jul. 7, 2011

Related U.S. Application Data

(60) Continuation of application No. 12/407,615, filed on Mar. 19, 2009, now Pat. No. 7,910,972, which is a continuation of application No. 11/457,423, filed on Jul. 13, 2006, now Pat. No. 7,525,141, which is a division of application No. 11/129,502, filed on May 13, 2005, now Pat. No. 7,371,627.

(51) Int. Cl.
*H01L 29/72* (2006.01)

(52) U.S. Cl. ........ 438/197; 438/368; 438/494; 438/587; 438/694; 438/791; 257/328; 257/401

(58) Field of Classification Search .............. 438/197, 438/268, 494, 587, 694, 791; 257/328, 401
See application file for complete search history.

(56) References Cited

U.S. PATENT DOCUMENTS

| 3,731,287 | A | 5/1973 | Seely et al. |
| 3,732,287 | A | 5/1973 | Himmele et al. |
| 3,941,629 | A | 3/1976 | Jaffe |

(Continued)

FOREIGN PATENT DOCUMENTS

JP 53148389 A2 5/1977

(Continued)

OTHER PUBLICATIONS

"Notes from IEDM, Part 3,", http://www.thinfilmmfg.com/Noteworthy/Noteworthy01/IEDM12Dec01.htm, Dec. 12, 2001, pp. 2.

(Continued)

*Primary Examiner* — Edward Wojciechowicz
(74) *Attorney, Agent, or Firm* — Knobbe Martens Olson & Bear, LLP

(57) ABSTRACT

A memory array with data/bit lines extending generally in a first direction formed in an upper surface of a substrate and access transistors extending generally upward and aligned generally atop a corresponding data/bit line. The access transistors have a pillar extending generally upward with a source region formed so as to be in electrical communication with the corresponding data/bit line and a drain region formed generally at an upper portion of the pillar and a surround gate structure substantially completely encompassing the pillar in lateral directions and extending substantially the entire vertical extent of the pillar and word lines extending generally in a second direction and in electrical contact with a corresponding surround gate structure at least a first surface thereof such that bias voltage applied to a given word line is communicated substantially uniformly in a laterally symmetric extent about the corresponding pillar via the surround gate structure.

20 Claims, 13 Drawing Sheets

U.S. PATENT DOCUMENTS

| | | |
|---|---|---|
| 4,139,442 A | 2/1979 | Bondur et al. |
| 4,234,362 A | 11/1980 | Riseman |
| 4,333,964 A | 6/1982 | Ghezzo |
| 4,419,809 A | 12/1983 | Riseman et al. |
| 4,432,132 A | 2/1984 | Kinsbron et al. |
| 4,470,062 A | 9/1984 | Muramatsu |
| 4,472,459 A | 9/1984 | Fisher |
| 4,502,914 A | 3/1985 | Trumpp et al. |
| 4,508,579 A | 4/1985 | Goth et al. |
| 4,508,757 A | 4/1985 | Fabricius et al. |
| 4,551,910 A | 11/1985 | Patterson |
| 4,570,325 A | 2/1986 | Higuchi |
| 4,615,762 A | 10/1986 | Jastrzebski et al. |
| 4,630,356 A | 12/1986 | Christie et al. |
| 4,648,937 A | 3/1987 | Ogura et al. |
| 4,716,131 A | 12/1987 | Okazawa et al. |
| 4,746,630 A | 5/1988 | Hui et al. |
| 4,776,922 A | 10/1988 | Bhattacharyya et al. |
| 4,789,560 A | 12/1988 | Yen |
| 4,838,991 A | 6/1989 | Cote et al. |
| 4,903,344 A | 2/1990 | Inoue |
| 4,959,325 A | 9/1990 | Lee et al. |
| 4,965,221 A | 10/1990 | Dennison et al. |
| 4,983,544 A | 1/1991 | Lu et al. |
| 5,013,680 A | 5/1991 | Lowrey et al. |
| 5,041,898 A | 8/1991 | Urabe et al. |
| 5,047,117 A | 9/1991 | Roberts |
| 5,053,105 A | 10/1991 | Fox, III |
| 5,057,449 A | 10/1991 | Lowrey et al. |
| 5,087,586 A | 2/1992 | Chan et al. |
| 5,117,027 A | 5/1992 | Bernhardt et al. |
| 5,122,848 A | 6/1992 | Lee et al. |
| 5,128,274 A | 7/1992 | Yabu et al. |
| 5,149,669 A | 9/1992 | Hosaka |
| 5,210,046 A | 5/1993 | Crotti |
| 5,252,504 A | 10/1993 | Lowrey et al. |
| 5,260,229 A | 11/1993 | Hodges et al. |
| 5,295,092 A | 3/1994 | Hotta |
| 5,305,252 A | 4/1994 | Saeki |
| 5,316,966 A | 5/1994 | Van der Plas et al. |
| 5,319,753 A | 6/1994 | MacKenna et al. |
| 5,328,810 A | 7/1994 | Lowrey et al. |
| 5,330,879 A | 7/1994 | Dennison |
| 5,334,548 A | 8/1994 | Shen et al. |
| 5,358,894 A | 10/1994 | Fazan et al. |
| 5,374,572 A | 12/1994 | Roth et al. |
| 5,409,563 A | 4/1995 | Cathey |
| 5,414,287 A | 5/1995 | Hong |
| 5,416,350 A | 5/1995 | Watanabe |
| 5,438,016 A | 8/1995 | Figura et al. |
| 5,457,067 A | 10/1995 | Han |
| 5,458,999 A | 10/1995 | Szabo et al. |
| 5,466,632 A | 11/1995 | Lur et al. |
| 5,468,675 A | 11/1995 | Kaigawa |
| 5,497,017 A | 3/1996 | Gonzales |
| 5,502,320 A | 3/1996 | Yamada |
| 5,514,885 A | 5/1996 | Myrick |
| 5,539,229 A | 7/1996 | Noble et al. |
| 5,561,308 A | 10/1996 | Kamata et al. |
| 5,563,012 A | 10/1996 | Neisser |
| 5,569,620 A | 10/1996 | Linn et al. |
| 5,583,065 A | 12/1996 | Miwa |
| 5,596,759 A | 1/1997 | Miller et al. |
| 5,604,159 A | 2/1997 | Cooper et al. |
| 5,607,874 A | 3/1997 | Wang et al. |
| 5,638,318 A | 6/1997 | Seyyedy |
| 5,670,794 A | 9/1997 | Manning |
| 5,675,164 A | 10/1997 | Brunner et al. |
| 5,677,865 A | 10/1997 | Seyyedy |
| 5,679,591 A | 10/1997 | Lin et al. |
| 5,680,344 A | 10/1997 | Seyyedy |
| 5,700,733 A | 12/1997 | Manning |
| 5,705,321 A | 1/1998 | Brueck et al. |
| 5,747,377 A | 5/1998 | Wu |
| 5,748,519 A | 5/1998 | Tehrani et al. |
| 5,753,546 A | 5/1998 | Koh et al. |
| 5,756,395 A | 5/1998 | Rostoker et al. |
| 5,780,349 A | 7/1998 | Naem |
| 5,789,269 A | 8/1998 | Mehta et al. |
| 5,789,306 A | 8/1998 | Roberts et al. |
| 5,789,320 A | 8/1998 | Andricacos et al. |
| 5,795,830 A | 8/1998 | Cronin et al. |
| 5,798,544 A | 8/1998 | Ohya et al. |
| 5,804,458 A | 9/1998 | Tehrani et al. |
| 5,821,600 A | 10/1998 | Chan |
| 5,834,359 A | 11/1998 | Jeng et al. |
| 5,841,611 A | 11/1998 | Sakakima et al. |
| 5,861,328 A | 1/1999 | Tehrani et al. |
| 5,864,496 A | 1/1999 | Mueller et al. |
| 5,892,708 A | 4/1999 | Pohm |
| 5,895,238 A | 4/1999 | Mitani |
| 5,895,273 A | 4/1999 | Burns et al. |
| 5,899,727 A | 5/1999 | Hause et al. |
| 5,902,690 A | 5/1999 | Tracy et al. |
| 5,905,285 A | 5/1999 | Gardner et al. |
| 5,907,170 A | 5/1999 | Forbes |
| 5,909,618 A | 6/1999 | Forbes et al. |
| 5,909,630 A | 6/1999 | Roberts et al. |
| 5,917,745 A | 6/1999 | Fujii |
| 5,917,749 A | 6/1999 | Chen et al. |
| 5,956,267 A | 9/1999 | Hurst et al. |
| 5,963,469 A | 10/1999 | Forbes |
| 5,963,803 A | 10/1999 | Dawson et al. |
| 5,977,579 A | 11/1999 | Noble |
| 5,981,318 A | 11/1999 | Blanchard |
| 5,998,256 A | 12/1999 | Juengling |
| 6,004,862 A | 12/1999 | Kim et al. |
| 6,005,798 A | 12/1999 | Sakakima et al. |
| 6,005,800 A | 12/1999 | Koch et al. |
| 6,008,106 A | 12/1999 | Tu et al. |
| 6,010,946 A | 1/2000 | Hisamune et al. |
| 6,042,998 A | 3/2000 | Brueck et al. |
| 6,049,106 A | 4/2000 | Forbes |
| 6,057,573 A | 5/2000 | Kirsch et al. |
| 6,063,688 A | 5/2000 | Doyle et al. |
| 6,066,191 A | 5/2000 | Tanaka et al. |
| 6,066,869 A | 5/2000 | Noble et al. |
| 6,071,789 A | 6/2000 | Yang et al. |
| 6,072,209 A | 6/2000 | Noble et al. |
| 6,077,745 A | 6/2000 | Burns et al. |
| 6,097,065 A | 8/2000 | Forbes et al. |
| 6,104,068 A | 8/2000 | Forbes |
| 6,104,633 A | 8/2000 | Abraham et al. |
| 6,111,782 A | 8/2000 | Sakakima et al. |
| 6,121,148 A | 9/2000 | Bashir et al. |
| 6,134,139 A | 10/2000 | Bhattacharyya et al. |
| 6,141,204 A | 10/2000 | Schuegraf et al. |
| 6,147,405 A | 11/2000 | Hu |
| 6,150,211 A | 11/2000 | Zahurak |
| 6,150,687 A | 11/2000 | Noble et al. |
| 6,150,688 A | 11/2000 | Maeda et al. |
| 6,157,064 A | 12/2000 | Huang |
| 6,165,833 A | 12/2000 | Parekh et al. |
| 6,172,391 B1 | 1/2001 | Goebel et al. |
| 6,174,780 B1 | 1/2001 | Robinson |
| 6,175,146 B1 | 1/2001 | Lane et al. |
| 6,191,470 B1 | 2/2001 | Forbes et al. |
| 6,211,044 B1 | 4/2001 | Xiang et al. |
| 6,229,169 B1 | 5/2001 | Hofmann et al. |
| 6,236,590 B1 | 5/2001 | Bhattacharyya et al. |
| 6,238,976 B1 | 5/2001 | Noble et al. |
| 6,246,083 B1 | 6/2001 | Noble |
| 6,265,742 B1 | 7/2001 | Gruening et al. |
| 6,271,080 B1 | 8/2001 | Mandelman et al. |
| 6,274,905 B1 | 8/2001 | Mo |
| 6,282,113 B1 | 8/2001 | Debrosse |
| 6,288,454 B1 | 9/2001 | Allman et al. |
| 6,291,334 B1 | 9/2001 | Somekh |
| 6,297,554 B1 | 10/2001 | Lin |
| 6,306,727 B1 | 10/2001 | Akram |
| 6,316,309 B1 | 11/2001 | Holmes et al. |
| 6,320,222 B1 | 11/2001 | Forbes et al. |
| 6,348,380 B1 | 2/2002 | Weimer et al. |
| 6,350,635 B1 | 2/2002 | Noble et al. |
| 6,355,961 B1 | 3/2002 | Forbes |
| 6,362,057 B1 | 3/2002 | Taylor, Jr. et al. |
| 6,368,950 B1 | 4/2002 | Xiang et al. |

| Patent No. | Date | Inventor |
|---|---|---|
| 6,376,317 B1 | 4/2002 | Forbes et al. |
| 6,377,070 B1 | 4/2002 | Forbes |
| 6,383,907 B1 | 5/2002 | Hasegawa et al. |
| 6,391,782 B1 | 5/2002 | Yu |
| 6,395,613 B1 | 5/2002 | Juengling |
| 6,396,096 B1 | 5/2002 | Park et al. |
| 6,399,979 B1 | 6/2002 | Noble et al. |
| 6,403,429 B2 | 6/2002 | Noble |
| 6,404,056 B1 | 6/2002 | Kuge et al. |
| 6,413,825 B1 | 7/2002 | Forbes |
| 6,414,356 B1 | 7/2002 | Forbes et al. |
| 6,423,474 B1 | 7/2002 | Holscher |
| 6,424,001 B1 | 7/2002 | Forbes et al. |
| 6,424,561 B1 | 7/2002 | Li et al. |
| 6,440,801 B1 | 8/2002 | Furukawa et al. |
| 6,448,601 B1 | 9/2002 | Forbes et al. |
| 6,455,372 B1 | 9/2002 | Weimer |
| 6,458,662 B1 | 10/2002 | Yu |
| 6,459,119 B1 | 10/2002 | Huang et al. |
| 6,461,957 B1 | 10/2002 | Yokoyama et al. |
| 6,468,887 B2 | 10/2002 | Iwasa et al. |
| 6,475,867 B1 | 11/2002 | Hui et al. |
| 6,475,869 B1 | 11/2002 | Yu |
| 6,492,233 B2 | 12/2002 | Forbes et al. |
| 6,496,034 B2 | 12/2002 | Forbes et al. |
| 6,498,062 B2 | 12/2002 | Durcan et al. |
| 6,500,763 B2 | 12/2002 | Kim et al. |
| 6,504,201 B1 | 1/2003 | Noble et al. |
| 6,504,255 B2 | 1/2003 | Keeth |
| 6,514,884 B2 | 2/2003 | Maeda |
| 6,522,584 B1 | 2/2003 | Chen et al. |
| 6,531,727 B2 | 3/2003 | Forbes et al. |
| 6,534,243 B1 | 3/2003 | Templeton |
| 6,537,870 B1 | 3/2003 | Shen |
| 6,538,916 B2 | 3/2003 | Ohsawa |
| 6,545,904 B2 | 4/2003 | Tran |
| 6,548,396 B2 | 4/2003 | Naik et al. |
| 6,551,878 B2 | 4/2003 | Clampitt et al. |
| 6,559,017 B1 | 5/2003 | Brown et al. |
| 6,559,491 B2 | 5/2003 | Forbes et al. |
| 6,566,280 B1 | 5/2003 | Meagley et al. |
| 6,566,682 B2 | 5/2003 | Forbes |
| 6,570,220 B2 | 5/2003 | Doyle et al. |
| 6,573,030 B1 | 6/2003 | Fairbairn et al. |
| 6,597,203 B2 | 7/2003 | Forbes |
| 6,602,779 B1 | 8/2003 | Li et al. |
| 6,617,060 B2 | 9/2003 | Weeks et al. |
| 6,617,651 B2 | 9/2003 | Ohsawa |
| 6,627,933 B2 | 9/2003 | Juengling |
| 6,632,741 B1 | 10/2003 | Clevenger et al. |
| 6,635,917 B2 | 10/2003 | Juengling |
| 6,638,441 B2 | 10/2003 | Chang et al. |
| 6,639,268 B2 | 10/2003 | Forbes et al. |
| 6,641,985 B2 | 11/2003 | Unno et al. |
| 6,645,806 B2 | 11/2003 | Roberts |
| 6,646,303 B2 | 11/2003 | Satoh et al. |
| 6,664,806 B2 | 12/2003 | Forbes et al. |
| 6,667,237 B1 | 12/2003 | Metzler |
| 6,669,165 B2 | 12/2003 | Burke |
| 6,670,642 B2 | 12/2003 | Takaura et al. |
| 6,673,684 B1 | 1/2004 | Huang et al. |
| 6,677,230 B2 | 1/2004 | Yokoyama et al. |
| 6,686,245 B1 | 2/2004 | Mathew et al. |
| 6,686,274 B1 | 2/2004 | Shimazu et al. |
| 6,689,695 B1 | 2/2004 | Lui et al. |
| 6,693,026 B2 | 2/2004 | Kim |
| 6,696,746 B1 | 2/2004 | Farrar et al. |
| 6,706,571 B1 | 3/2004 | Yu et al. |
| 6,707,092 B2 | 3/2004 | Sasaki |
| 6,709,807 B2 | 3/2004 | Hallock et al. |
| 6,710,387 B2 | 3/2004 | Nakamura et al. |
| 6,710,402 B2 | 3/2004 | Harada |
| 6,723,607 B2 | 4/2004 | Nam et al. |
| 6,727,168 B2 | 4/2004 | Abbott |
| 6,734,063 B2 | 5/2004 | Willer et al. |
| 6,734,107 B2 | 5/2004 | Lai et al. |
| 6,734,482 B1 | 5/2004 | Tran et al. |
| 6,734,484 B2 | 5/2004 | Wu |
| 6,744,094 B2 | 6/2004 | Forbes |
| 6,756,284 B2 | 6/2004 | Sharma |
| 6,756,625 B2 | 6/2004 | Brown |
| 6,764,949 B2 | 7/2004 | Bonser et al. |
| 6,768,663 B2 | 7/2004 | Ogata |
| 6,773,998 B1 | 8/2004 | Fisher et al. |
| 6,777,725 B2 | 8/2004 | Willer et al. |
| 6,781,212 B1 | 8/2004 | Kao et al. |
| 6,794,699 B2 | 9/2004 | Bissey et al. |
| 6,794,710 B2 | 9/2004 | Chang et al. |
| 6,797,573 B2 | 9/2004 | Brown |
| 6,798,009 B2 | 9/2004 | Forbes et al. |
| 6,800,930 B2 | 10/2004 | Jackson et al. |
| 6,801,056 B2 | 10/2004 | Forbes |
| 6,806,137 B2 | 10/2004 | Tran et al. |
| 6,808,979 B1 | 10/2004 | Lin et al. |
| 6,811,954 B1 | 11/2004 | Fukuda |
| 6,812,092 B2 | 11/2004 | Seitz et al. |
| 6,825,529 B2 | 11/2004 | Chidambarrao et al. |
| 6,828,580 B2 | 12/2004 | Zhang |
| 6,835,663 B2 | 12/2004 | Lipinski |
| 6,835,988 B2 | 12/2004 | Yamashita |
| 6,844,591 B1 | 1/2005 | Tran |
| 6,844,594 B2 | 1/2005 | Juengling |
| 6,846,618 B2 | 1/2005 | Hsu et al. |
| 6,867,116 B1 | 3/2005 | Chung |
| 6,875,703 B1 | 4/2005 | Furukawa et al. |
| 6,881,627 B2 | 4/2005 | Forbes et al. |
| 6,882,006 B2 | 4/2005 | Maeda et al. |
| 6,888,187 B2 | 5/2005 | Brown et al. |
| 6,888,755 B2 | 5/2005 | Harari |
| 6,890,812 B2 | 5/2005 | Forbes et al. |
| 6,890,858 B2 | 5/2005 | Juengling et al. |
| 6,893,972 B2 | 5/2005 | Rottstegge et al. |
| 6,894,354 B2 | 5/2005 | Jono et al. |
| 6,900,521 B2 | 5/2005 | Forbes et al. |
| 6,905,628 B2 | 6/2005 | Bjarnason et al. |
| 6,924,191 B2 | 8/2005 | Liu et al. |
| 6,926,843 B2 | 8/2005 | Cantell et al. |
| 6,936,507 B2 | 8/2005 | Tang et al. |
| 6,939,808 B2 | 9/2005 | Tzou et al. |
| 6,946,709 B2 | 9/2005 | Yang |
| 6,951,709 B2 | 10/2005 | Li |
| 6,955,961 B1 | 10/2005 | Chung |
| 6,960,510 B2 | 11/2005 | Deshpande et al. |
| 6,960,832 B2 | 11/2005 | Shimazu et al. |
| 6,962,867 B2 | 11/2005 | Jackson et al. |
| 6,964,391 B2 | 11/2005 | Hiraguchi |
| 6,964,895 B2 | 11/2005 | Hsu |
| 6,967,140 B2 | 11/2005 | Doyle |
| 6,998,319 B2 | 2/2006 | Tanaka |
| 7,005,240 B2 | 2/2006 | Manger et al. |
| 7,012,024 B2 | 3/2006 | Abbott |
| 7,015,124 B1 | 3/2006 | Fisher et al. |
| 7,034,336 B2 | 4/2006 | Willer |
| 7,042,047 B2 | 5/2006 | Eppich |
| 7,045,859 B2 | 5/2006 | Amali et al. |
| 7,049,702 B2 | 5/2006 | Tseng |
| 7,056,786 B2 | 6/2006 | Yun et al. |
| 7,071,043 B2 | 7/2006 | Tang et al. |
| 7,078,296 B2 | 7/2006 | Chau et al. |
| 7,091,566 B2 | 8/2006 | Zhu et al. |
| 7,098,105 B2 | 8/2006 | Juengling |
| 7,098,536 B2 | 8/2006 | Yang et al. |
| 7,105,089 B2 | 9/2006 | Fanselow et al. |
| 7,109,544 B2 | 9/2006 | Schloesser et al. |
| 7,112,483 B2 | 9/2006 | Lin et al. |
| 7,112,815 B2 | 9/2006 | Prall |
| 7,115,525 B2 | 10/2006 | Abatchev et al. |
| 7,118,960 B2 | 10/2006 | Tran |
| 7,119,020 B2 | 10/2006 | Okamura et al. |
| 7,120,046 B1 | 10/2006 | Forbes |
| 7,122,425 B2 | 10/2006 | Chance et al. |
| 7,151,040 B2 | 12/2006 | Tran et al. |
| 7,151,690 B2 | 12/2006 | Forbes |
| 7,153,734 B2 | 12/2006 | Brask et al. |
| 7,176,109 B2 | 2/2007 | Ping et al. |
| 7,176,125 B2 | 2/2007 | Liaw |
| 7,182,823 B2 | 2/2007 | Mandigo et al. |
| 7,183,164 B2 | 2/2007 | Haller |

| | | |
|---|---|---|
| 7,183,205 B2 | 2/2007 | Hong |
| 7,183,597 B2 | 2/2007 | Doyle |
| 7,199,419 B2 | 4/2007 | Haller |
| 7,205,192 B2 | 4/2007 | Kweon |
| 7,205,598 B2 | 4/2007 | Voshell et al. |
| 7,208,379 B2 | 4/2007 | Venugopal et al. |
| 7,214,629 B1 | 5/2007 | Luo et al. |
| 7,226,853 B2 | 6/2007 | Bekiaris et al. |
| 7,238,580 B2 | 7/2007 | Orlowski et al. |
| 7,253,118 B2 | 8/2007 | Tran et al. |
| 7,262,089 B2 | 8/2007 | Abbott et al. |
| 7,268,054 B2 | 9/2007 | Tran et al. |
| 7,271,107 B2 | 9/2007 | Marks et al. |
| 7,285,812 B2 | 10/2007 | Tang et al. |
| 7,371,627 B1 * | 5/2008 | Forbes ............ 438/197 |
| 7,372,091 B2 | 5/2008 | Leslie |
| 7,384,868 B2 | 6/2008 | Cabral et al. |
| 7,390,746 B2 | 6/2008 | Bai et al. |
| 7,393,789 B2 | 7/2008 | Abatchev et al. |
| 7,396,767 B2 | 7/2008 | Wu et al. |
| 7,396,781 B2 | 7/2008 | Wells |
| 7,413,981 B2 | 8/2008 | Tang et al. |
| 7,510,954 B1 | 3/2009 | Forbes |
| 7,525,141 B1 | 4/2009 | Forbes |
| 7,601,595 B2 | 10/2009 | Forbes |
| 7,626,219 B2 | 12/2009 | Forbes |
| 7,838,360 B2 | 11/2010 | Forbes |
| 7,888,721 B2 | 2/2011 | Forbes |
| 7,910,972 B2 | 3/2011 | Forbes |
| 2001/0005631 A1 | 6/2001 | Kim et al. |
| 2001/0019870 A1 | 9/2001 | Noble |
| 2002/0000608 A1 | 1/2002 | Harada |
| 2002/0005590 A1 | 1/2002 | Keeth |
| 2002/0024081 A1 | 2/2002 | Gratz |
| 2002/0028541 A1 | 3/2002 | Lee et al. |
| 2002/0030214 A1 | 3/2002 | Horiguchi |
| 2002/0038886 A1 | 4/2002 | Mo |
| 2002/0042198 A1 | 4/2002 | Bjarnason et al. |
| 2002/0043690 A1 | 4/2002 | Doyle et al. |
| 2002/0045308 A1 | 4/2002 | Juengling |
| 2002/0061639 A1 | 5/2002 | Itonaga |
| 2002/0063110 A1 | 5/2002 | Cantell et al. |
| 2002/0121673 A1 | 9/2002 | Jono et al. |
| 2002/0123216 A1 | 9/2002 | Yokoyama et al. |
| 2002/0127810 A1 | 9/2002 | Nakamura |
| 2002/0130348 A1 | 9/2002 | Tran |
| 2002/0130686 A1 | 9/2002 | Forbes |
| 2002/0135004 A1 | 9/2002 | Uh et al. |
| 2002/0135029 A1 | 9/2002 | Ping et al. |
| 2002/0158273 A1 | 10/2002 | Satoh et al. |
| 2002/0182847 A1 | 12/2002 | Yokoyama et al. |
| 2002/0187356 A1 | 12/2002 | Linthicum et al. |
| 2003/0001290 A1 | 1/2003 | Nitayama et al. |
| 2003/0006410 A1 | 1/2003 | Doyle |
| 2003/0008461 A1 | 1/2003 | Forbes et al. |
| 2003/0015757 A1 | 1/2003 | Ohsawa |
| 2003/0040186 A1 | 2/2003 | Juengling et al. |
| 2003/0042542 A1 | 3/2003 | Maegawa et al. |
| 2003/0044722 A1 | 3/2003 | Hsu et al. |
| 2003/0077855 A1 | 4/2003 | Abbott |
| 2003/0085422 A1 | 5/2003 | Amali et al. |
| 2003/0119307 A1 | 6/2003 | Bekiaris et al. |
| 2003/0127426 A1 | 7/2003 | Chang et al. |
| 2003/0132480 A1 | 7/2003 | Chau et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0218199 A1 | 11/2003 | Forbes et al. |
| 2003/0227072 A1 | 12/2003 | Forbes et al. |
| 2003/0230234 A1 | 12/2003 | Nam et al. |
| 2003/0234414 A1 | 12/2003 | Brown |
| 2004/0000534 A1 | 1/2004 | Lipinski |
| 2004/0002203 A1 | 1/2004 | Deshpande, V et al. |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0036095 A1 | 2/2004 | Brown et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0070007 A1 | 4/2004 | Zhang |
| 2004/0079456 A1 | 4/2004 | Mandigo et al. |
| 2004/0079988 A1 | 4/2004 | Harari |
| 2004/0094786 A1 | 5/2004 | Tran et al. |
| 2004/0105330 A1 | 6/2004 | Juengling |
| 2004/0106257 A1 | 6/2004 | Okamura et al. |
| 2004/0150111 A1 | 8/2004 | Shimazu et al. |
| 2004/0195613 A1 | 10/2004 | Kweon |
| 2004/0197989 A1 | 10/2004 | Sommer et al. |
| 2004/0217391 A1 | 11/2004 | Forbes |
| 2004/0235255 A1 | 11/2004 | Tanaka et al. |
| 2005/0001232 A1 | 1/2005 | Bhattacharyya |
| 2005/0037584 A1 | 2/2005 | Abbott |
| 2005/0045965 A1 | 3/2005 | Lin et al. |
| 2005/0046048 A1 | 3/2005 | Yun et al. |
| 2005/0048714 A1 | 3/2005 | Noble |
| 2005/0059242 A1 | 3/2005 | Cabral et al. |
| 2005/0074949 A1 | 4/2005 | Jung et al. |
| 2005/0079721 A1 | 4/2005 | Buerger et al. |
| 2005/0104090 A1 | 5/2005 | Juengling |
| 2005/0145913 A1 | 7/2005 | Katsumata et al. |
| 2007/0049040 A1 | 3/2007 | Bai et al. |
| 2009/0256181 A1 | 10/2009 | Forbes |
| 2011/0121383 A1 | 5/2011 | Forbes |
| 2011/0140184 A1 | 6/2011 | Forbes |
| 2011/0165744 A1 | 7/2011 | Forbes |

FOREIGN PATENT DOCUMENTS

| | | |
|---|---|---|
| JP | 60167349 A2 | 8/1985 |
| JP | 1100948 A2 | 4/1989 |
| JP | 2219253 A2 | 8/1990 |
| JP | 4130630 A2 | 9/1990 |
| JP | 4162528 A2 | 6/1992 |

OTHER PUBLICATIONS

"Quantum Confinement Effects in a 3D FinFET Transistor,", http://www.ise.com/appex/FinFET/FinFET.html, Jan. 15, 2003, pp. 5 pages.

Ahn, S.J. et al., Highly Scalable and CMOS-Compatible STTM Cell Technology,, IEEE International Electron Devices Meeting 2003, 2003, pp. 10.4.1-10.4.4, Piscataway, NJ, USA.

Ahn, S.J. et al., "Examination and Improvement of Reading Disturb Characteristics of a Surrounded Gate STTM Memory Cell,", 2003 Third IEEE Conference on Nanotechnology, IEEE-NANO 2003. Proceedings (Cat. No. 03TH8700), 2003, vol. 2, pp. 528-530, Piscataway, NJ, USA.

Cho, Hyun-Jin et al., "A Novel Pillar DRAM Cell 4 Gbit and Beyond,", Digest of Technical Papers Symposium on VLSI Technology, Jun. 1, 1998, pp. 38-39.

Cho, Hyun-Jin et al., "High Performance Fully and Partially Depleted Poly-Si Surrounding Gate Transistors,", 1999 Symposium on VLSI Technology Digest of Technical Papers (IEEE Cat. No. 99CH 36325), 1999, pp. 31-32, Tokyo, Japan.

Clarke, Peter, "ISSCC: Vertical Transistor Structures Considered", EE Times Website, http://www.eetimes.com, Feb. 1, 2000, pp. 3 pages.

Date, C.K. et al., "Suppression of the Floating-Body Effect Using SiGe Layers in Vertical Surrounding-Gate MOSFETs,", IEEE Transactions on Electron Devices, Dec. 1, 2001, vol. 48, Issue 12, pp. 2684-2689.

De, Indranil et al., "Impact of Gate Workfunction on Device Performance at the 50 nm Technology Node,", Solid-State Electronics, Jun. 1, 2000, vol. 44, Issue 6, pp. 1077-1080.

Denton, Jack P. et al., "Fully Depleted Dual-Gate Thin-Film SOI P-MOSFET's Fabricated in SOI Islands With an Isolated Buried Polysilicon Backgate,", IEEE Electron Device Letters, Nov. 1, 1996, vol. 17, Issue 11, pp. 509-511.

Doyle, B. et al., "Tri-Gate Fully-Depleted CMOS Transistors: Fabrication, Design and Layout,", 2003 Symposium on VLSI Technology, Digest of Technical Papers, 2003, pp. 133-134, Tokyo, Japan.

Doyle, B.S. et al., "High Performance Fully-Depleted Tri-Gate CMOS Transistors,", IEEE Electron Device Letters, Apr. 1, 2003, vol. 24, Issue 4.

Endoh T. et al., "Floating Channel Type SGT Flash Memory,", Transactions of the Institute of Electronics, Information and Communication Engineers C-I, Mar. 1, 1999, vol. J82-C1, Issue 3, pp. 134-135.

Endoh T. et al., "The 1.44F2 Memory Cell Technology With the Stacked-Surrounding Gate Transistor (S-SGT) DRAM,", Proceedings 22nd International Conference on Microelectronics, May 14-17, 2000, vol. 2, pp. 451-454.

Endoh, Testuo et al., "Analysis of High Speed Operation for Multi-SGT,", Transactions of the Institute of Electronics, Information and Communication Engineers C-1, Aug. 1, 1997, vol. J80C-I, Issue 8, pp. 382-383.

Endoh, Tetsuo et al., "A High Signal Swing Pass-Transistor Logic Using Surrounding Gate Transistor,", Simulation of Semiconductor Processes and Devices, 2000, SISPAD 2000, 2000 International Conference, Sep 6-8, 2000, pp. 273-275.

Endoh, Tetsuo et al., "Novel Ultra High Density Flash Memory With a Stacked-Surrounding Gate Transistor (S-SGT) Structured Cell,", IEEE Transactions on Electron Devices, Apr. 2003, vol. 50, Issue 4, pp. 945-951.

Endoh, Tetsuo et al., "Novel Ultra High Density Flash Memory With a Stacked-Surrounding Gate Transistor (S-SGT) Structured Cell,", International Electron Devices Meeting, Technical Digest IEEE, 2001, pp. 2.3.1-2.3.4.

Endoh, Tetsuo et al., "The Analysis of the Stacked-Surrounding Gate Transistor (S-SGT) DRAM for the High Speed and Low Voltage Operation,", IEICE Transactions on Electronics, Sep. 1, 1998, vol. E81-C, Issue 9, pp. 1491-1498.

Endoh, Tetsuo et al., "The Stacked-SGT DRAM Using 3d-Building Memory Array Technology,", Transactions of the Institute of Electronics, Information and Communication Engineers C-I, May 1998, vol. J81CI, Issue 5, pp. 288-289.

Endoh, Tetsuo et al., "An Accurate Model of Fully-Depleted Surrounding Gate Transistor (FD-SGT),", IEICE Transactions on Electronics, Jul. 1, 1997, vol. E80-C, Issue 7, pp. 905-910.

Endoh, Tetsuo et al., "An Analytic Steady-State Current-Voltage Characteristic of Short Channel Fully-Depleted Surrounding Gate Transistor (FD-SGT),", IEICE Transactions on Electronics, Jul. 1, 1997, vol. E80-C, Issue 7, pp. 911-917.

Endoh, Tetsuo et al., "The 2.4F2 Memory Cell Technology With Stacked-Surrounding Gate Transistor (S-Sgt) Dram,", IEEE Transactions of the Institute of Electronics, Aug. 1, 2001, vol. 48, Issue 8, pp. 1599-1603.

Final Office Action, dated Aug. 23, 2007, for U.S. Appl. No. 11/175,677.

Forbes, "DRAM Array with Surrounding Gate Access Transistors and Capacitors Over Global Bit Lines,", Surroundingdisc4.doc, Sep. 14, 2004.

Goebel, B. et al., "Fully Depleted Surrounding Gate Transistor (SGT) for 70 nm DRAM and Beyond,", IEEE, 2002, pp. 5.

Hioki, Masakazu et al., "An Analysis of Program and Erase Operation for FC-SGT Flash Memory Cells,", Simulation of Semiconductor Processes and Devices, 2000, SISPAD 2000, 2000 International Conference, 2000, pp. 116-118.

Huang, Xuejue et al., "Sub-50 nm P-Channel FinFET,", IEEE Transactions on Electron Devices IEEE Transactions on Electron Devices IEEE Transactions on Electron Devices, May 2001, vol. 48, Issue 5.

Iwai, Makoto et al., "Buried Gate Type SGT Flash Memory,", Transactions of the Institute of Electronics, Information and Communication Engineers C, May 2003, vol. J86-C, Issue 5, pp. 562-564.

Kalavade, Pranav et al., "A Novel Sub-10nm Transistor,", IEEE Device Research Conf., Jun. 2000, pp. 71-72, Denver, CO.

Kedzierski, Jakub et al., "High-Performance Symmetric-Gate and CMOS-Compatible Vt Asymmetric-Gate FinFET Devices,", IEDM, 2001, vol. 19.5, pp. 4.

Kim, K. et al., "Nanoscale CMOS Circuit Leakage Power Reduction by Double Gate Device,", International Symposium on Low Power Electronics and Design, 2004, pp. 102-107, Newport, California.

Kranti, A. et al., "Optimisation for Improved Short-Channel Performance of Surrounding/Cylindrical Gate MOSFETs,", Electronics Letter, Apr. 2001, vol. 37, Issue 8, pp. 533-534.

Kranti, Abhinav et al., "An Analytical Temperature Dependent Threshold Voltage Model for Thin Film Surrounded Gate SOI MOSFET,", Proceedings of the SPIE—The International Society for Optical Engineering, 2000, vol. 3975, pp. 605-608.

Lau et al., "High Aspect Ration Submicron Silicon Pillars Fabricated by Photoassisted electrochemical Etching and Oxidation,", Applied Physics Letters, Sep. 25, 1995, vol. 67, Issue 13, pp. 1877-1879.

Lau et al., "High Aspect Ration Submicron Silicon Pillars for Light Emission Studies and Photonic Band Gap Material Application,", 1995/6 Research Journal, Microelectric Group, Jun. 1, 1996, pp. 3 pages.

Lutze et al., "Field Oxide Thinning in Poly Buffer LOCOS Isolation With jActive Area Spacings to 0.1um,", Journal of Electrochemical Society, Jun. 1, 1990, vol. 137, Issue 6, pp. 1867-1870.

Mandelman et al., "Challenges and Future Directions for the Scaling of Dynamic Random-Access Memory (DRAM),", IBM J. Res. & Dev, Mar./May 2002, vol. 46, Issue 2-3, pp. 187-212.

Matsuoka, F. et al., "Numerical Analysis of Alpha-Particle-Induced Soft Errors in Floating Channel Type Surrounding Gate Transistor (FC-SGT) DRAM Cell,", Electron—Devices IEEE Transactions on, Jul. 2003, vol. 50, Issue 7, pp. 1638-1644.

Matsuoka, Fumiyoshi et al., "A Study of Soft Error in SGT DRAM,", Record of Electrical and Communication Engineering Conversazione Tohoku University, Oct. 1, 2002, vol. 71, Issue 1, pp. 469-470 Journal Paper.

Miyamoto, Shoichi et al., "Effect of LDD Structure and Channel Poly-Si Thinning on a Gate-All-Around TFT (GAT) for SRAM's,", IEEE Transactions on Electron Devices, Aug. 1999, vol. 46, Issue 8, pp. 19693-1698.

Miyano, Shinji, et al., "Numerical Analysis of a Cylindrical Thin-Pillar Transistor (CYNTHIA),", IEEE Transactions on Electron Devices, Aug. 1992, vol. 39, Issue 8, pp. 1876-1881.

Nakamura, Tairiku, "A Study of Steady-State Characteristics of Sgt Type Three-Dimensional MOS Transistor,", Record of Electrical and Communication Engineering Conversazione Tohoku University, Jan. 1, 1998, vol. 66, Issue 1, pp. 211-212.

Nishi, Ryohsuki et al., "Analysis of the Shape of Diffusion Layer of Sgt for Suppressing Substrate Bias Effect,", Transactions of the Institute of Electronics, Information and Communication Engineers C, Oct. 1, 2001, vol. J84-C, Issue 10, pp. 1018-1020.

Nishi, Ryohsuki, et al., "Concave Source SGT for Suppressing Punch-Through Effect,", Transactions of the Institute of Electronics, Information and Communication Engineers C, Feb. 1, 2003, vol. J86-C, Issue 2, pp. 200-201.

Nitayama, A. et al., "High Speed and Compact CMOS Circuits With Multi-Pillar Surrounding Gate Transistors,", IEEE Transactions on Electron Devices, Nov. 1, 1989, vol. 36, Issue 11, pp. 2605-2606.

Nitayama, Akihiro, "Multi-Pillar Surrounding Gate Transistor (M-SGT) for Compact and High-Speed Circuits,", IEEE Transactions on Electron Devices, Mar. 1, 1991, vol. 28, Issue 3, pp. 579-583.

Non-Final Office Action, dated Mar. 1, 2007, for U.S. Appl. No. 11/175,677.

Notice of Allowance, dated Aug. 15, 2006, for U.S. Appl. No. 11/128,585.

Response to Office Action, filed Jun. 1, 2007, for U.S. Appl. No. 11/175,677.

Response to Restriction Requirement, filed Aug. 3, 2006, for U.S. Appl. No. 11/128,585.

Response to Restriction Requirement, filed Jan. 10, 2007, for U.S. Appl. No. 11/175,677.

Response to Restriction Requirement, filed Nov. 1, 2006, for U.S. Appl. No. 11/175,677.

Restriction Requirement, dated Dec. 13, 2006, for U.S. Appl. No. 11/175,677.

Restriction Requirement, dated Jul. 11, 2006, for U.S. Appl. No. 11/128,585.

Restriction Requirement, dated Nov. 3, 2006, for U.S. Appl. No. 11/175,677.

Sakai, Takeshi et al., "A Study of Stacked-SGT-Based Pass-Transistor Logic Circuit,", Record of Electrical and Communication Engineering Conversazione Tohoku University, Feb. 1, 2004, vol. 72, Issue 2, pp. 108-109.

Sakamoto, Wataru et al., "A Study of Current Drivability of SGT,", Record of Electrical and Communication Engineering Conversazione Tohoku University, Feb. 1, 2004, vol. 72, Issue 2, pp. 110-111.

Seeger et al., Fabricaton of Ordered Arrays of Silicon Nanopillars, , J.Phys. D: Appl Phys, 1999, vol. 32, pp. L129-L132.

Sunouchi, K. et al., "A Surrounding Gate Transistor (SGT) Cell for 64/256 Mbit DRAMs,", International Electron Devices Meeting 1989, Technical Digest (Cat. No. 89CH2637-7), Dec. 1989, pp. 23-26, New York, NY, USA.

Suzuki, Masahiko, "The 2.4F2 Memory Cell Technology with Stacked-Surrounding Gate Transistor (S-SGT) DRAM,", Transactions of the Institute of Electronics, C, Jan. 1, 2000, vol. J83-C, Issue 1, pp. 92-94, Japan.

Takato, H. et al., "Impact of Surrounding Gate Transistor (SGT) for Ultra-High Density LSI's,", IEEE Transactions on Electron Devices, Mar. 1, 1991, vol. 38, Issue 3, pp. 573-578.

Takato, H. et al., "High Performance CMOS Surrounding Gate Transistor (SGT) for Ultra High Density LSIs,", IEEE Electron Devices Meeting, Technical Digest, 1988, pp. 222-225.

Terauchi, M et al., "A Surrounding Gate Transistor (SGT) Gain Cell for Ultra High Density DRAMs,", 1993 Symposium on VLSI Technology, Digest of Technical Papers (IEEE Cat. No. 93CH 3303-5), 1993, pp. 21-22, Tokyo, Japan.

Terauchi, Mamoru et al., "Depletion Isolation Effect of Surrounding Gate Transistors,", IEEE Transactions on, Dec. 1, 1997, vol. 44, Issue 12, pp. 2303-2305.

Watanabe, Shigeyoshi et al. "A Novel Circuit Technology With Surrounding Gate Transistors (SGT's) for Ultra High Density DRAM's,", IEEE Journal of Solid-State Circuits, Sep. 1, 1995, vol. 30, Issue 9, pp. 960-971.

Watanabe, Shigeyoshi, "Impact of Three-Dimensional Transistor on the Pattern Area Reduction for ULSI,", IEEE Transaction on Electron Devices, Oct. 1, 2003, vol. 50, Issue 10, pp. 2073-2080.

Wolf et al., "Silicon Processing for the VLSI Era", Lattice Press, 1986, vol. 1, pp. 529-555, USA.

Wong, Hon-Sum P., et al., "Self-Aligned (Top and Bottom) Double-Gate MOSFET With a 25nm Thick Silicon Channel,", IEEE Int. Electron Device Meeting, 1997, pp. 427-430.

Xuan, Pieqi et al. "60nm Planarized Ultra-Thin Body Solid Phase Epitaxy MOSFET's,", IEEE Device Research Conf., Jun. 1, 2000, pp. 67-68, Denver, CO.

Yamashita, Hiroomi et al., "A Study of Process Design in Three Dimensional Sgt Device,", Record of Electrical and Communication Engineering Conversazione Tohoku University, Oct. 1, 2002, vol. 71, Issue 1, pp. 467-468.

Zhang, Wei et al., "A study of Load Capacitance in SGT,", Record of Electrical and Communication Engineering Conversazione Tohoku University, Oct. 2002, vol. 71, Issue 1, pp. 473-474.

* cited by examiner

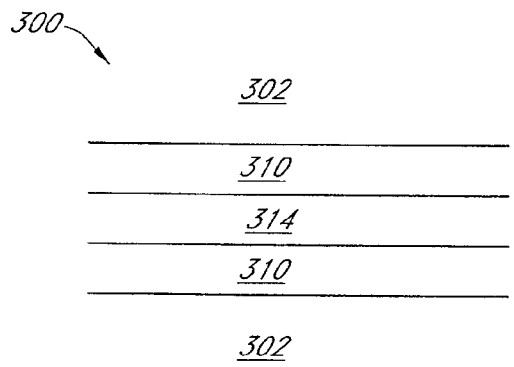
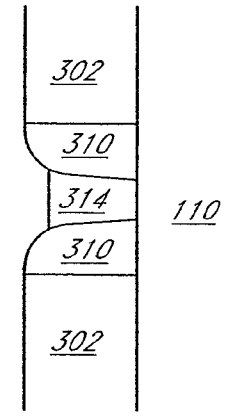
FIG. 14A          FIG. 14B
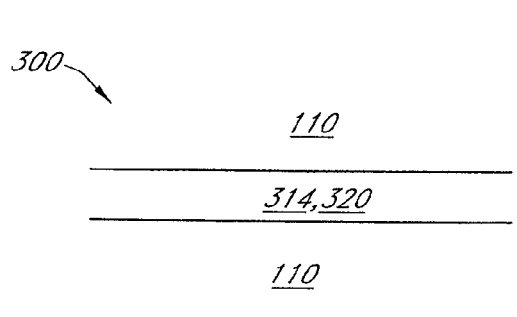
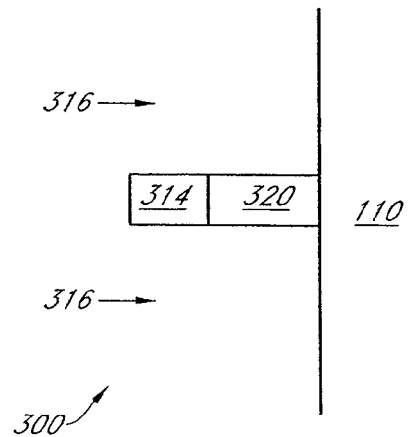
FIG. 15A          FIG. 15B

MEMORY ARRAY WITH ULTRA-THIN ETCHED PILLAR SURROUND GATE ACCESS TRANSISTORS AND BURIED DATA/BIT LINES

CROSS-REFERENCE TO RELATED APPLICATIONS

This application is a continuation of U.S. patent application Ser. No. 12/407,615, filed Mar. 19, 2009, which is a continuation of U.S. patent application Ser. No. 11/457,423, filed Jul. 13, 2006, now U.S. Pat. No. 7,525,141, which is a divisional application of U.S. patent application Ser. No. 11/129,502, filed May 13, 2005, now U.S. Pat. No. 7,371,627, which are hereby incorporated by reference in their entireties.

BACKGROUND OF THE INVENTION

1. Field of the Invention

The invention relates to the field of high density semiconductor memory arrays and more particularly to arrays with vertical transistors having sub-photolithographic device dimensions with ultra-thin pillars and substantially fully surrounding gates suitable for use as access transistors, such as for DRAM arrays.

2. Description of the Related Art

Ongoing scaling of metal oxide semiconductor field effect transistor (MOSFET) technology to the deep sub-micron region where channel lengths are less than 0.1 micron (100 nanometers or 1,000 Å) causes significant problems in conventional transistor structures. Generally, junction depth should be much less than the channel length, and thus for a channel length of, for example, 1,000 Å, this implies junction depths on the order of a few hundred Angstroms. Such shallow junctions are difficult to form by conventional implantation and diffusion techniques.

FIG. 1 illustrates general trends and relationships for a variety of device parameters with scaling by a factor k. As another example, with an aggressive scaling factor, extremely high levels of channel doping are required to suppress undesirable short channel effects, such as drain induced barrier lowering (DIBL), threshold voltage roll off, and sub-threshold conduction. Sub-threshold conduction is particularly problematic in dynamic random access memory (DRAM), as it significantly reduces the charge storage retention time of the capacitor cells. Extremely high doping level generally results in increased leakage and reduced carrier mobility, thus making the channel shorter to improve performance is offset or negated by the lower carrier mobility and higher leakage. This leakage current is a significant concern and problem in low voltage and low power battery operated complimentary metal oxide semiconductor (CMOS) circuits and systems, particularly in DRAMs.

This is shown in FIG. 2 as that if low voltages are used for this low power operation, then there is a problem with threshold voltages and standby leakage current being of large enough value to degrade overall circuit performance. For example, to achieve significant overdrive and reasonable system switching speeds, the threshold voltage magnitudes are desirably small, in this example near 0 volts, however then the transistor, such as an access transistor, will always have a large sub-threshold leakage current. Various technologies have been employed to allow low voltage operation with deep sub-micron CMOS transistors that can have relatively large variations in threshold voltage, yet still have relatively low sub-threshold leakage currents at standby.

For example, one technique used in scaling down transistors is referred to as dual-gated or double-gated transistor structures. The terminology generally employed in the industry is "dual-gate" if the transistor has a front gate and a back gate which can be driven with separate and independent voltages and "double-gated" to describe structures where both gates are driven with the same potential. In certain aspects, a dual-gated and/or double-gated MOSFET offers better device characteristics than conventional bulk silicon MOSFETs. Because a gate electrode is present on both sides of the channel, rather than only on one side as in conventional planar MOSFETs, the electrical field generated by the drain electrode is better screened from the source end of the channel than in conventional planar MOSFETs, as illustrated schematically by the field lines in FIG. 3.

This can result in an improved sub-threshold leakage current characteristic, as illustrated schematically in FIG. 4. The dual-gate and/or double-gate MOSFET turns off and the sub-threshold current is reduced more quickly as the gate voltage is reduced. However, even though dual gate and/or double gate structures offer advantages over conventional bulk silicon MOSFETs, there remains a desire for continued improvement in device performance, for example, reduced sub-threshold leakage current, particularly with continued scaling.

SUMMARY OF THE INVENTION

The above referenced needs are satisfied by the invention which in one embodiment is a memory array comprising a semiconductive substrate, a plurality of conductive data/bit lines extending generally in a first direction and formed in an upper surface of the substrate, a plurality of access transistors extending generally upward from the upper surface of the substrate and aligned generally atop a corresponding data/bit line, wherein the access transistors comprise a pillar extending generally upward from the upper surface of the substrate and generally aligned atop the corresponding data/bit line wherein a source region is formed generally at a lower portion of the pillar so as to be in electrical communication with the corresponding data/bit line and a drain region is formed generally at an upper portion of the pillar, wherein the pillar intermediate the source and drain regions is substantially fully depleted and a surround gate structure substantially completely encompassing the pillar in lateral directions and extending substantially the entire vertical extent of the pillar, and a plurality of conductive word lines extending generally in a second direction and in electrical contact with a corresponding surround gate structure at least a first surface thereof such that bias voltage applied to a given word line is communicated substantially uniformly in a lateral extent about the corresponding pillar via the surround gate structure.

Another embodiment is a method of fabricating a memory array comprising forming a plurality of data/bit lines in a surface of a substrate so as to extend in a first direction, forming a first mask layer on the surface of the substrate, forming first elongate openings in the first mask layer so as to be aligned generally with and extending along corresponding data/bit lines, depositing sidewall material in the first openings of the first mask layer, directionally etching the sidewall material so as to form first sidewall spacers arranged against inner surfaces of the first openings and defining generally centrally arranged first trenches in the first sidewall spacers between opposed sidewall spacers, forming first plug strips in corresponding first trenches, performing a directional etch with the first plug strips as masking structures so as to define a corresponding plurality of pillar strips extending generally vertically from the surface of the substrate and substantially conforming to the contour and position of the first plug strips, filling interstitial spaces between the pillar strips with fill material, forming a second mask layer on the surface of the substrate, forming second elongate openings in the second mask layer so as to overlie in an intersecting manner and extend in a second direction across corresponding data/bit lines and the pillar strips, depositing sidewall material in the second openings of the second mask layer, directionally etching the sidewall material so as to form second sidewall spacers arranged against inner surfaces of the second openings and defining generally centrally arranged second trenches in the second sidewall spacers between opposed sidewall spacers, forming second plug strips in corresponding second trenches, performing a directional etch with the second plug strips as masking structures so as to define a corresponding plurality of pillars extending generally vertically from the surface of the substrate and substantially conforming to the contour and position of intersections of the first and the second plug strips, and forming gate structures about the pillars such that the gate structures substantially completely laterally encompass corresponding pillars.

A further embodiment is a method of fabricating a memory array comprising forming a plurality of data/bit lines in a surface of a substrate, forming a mask layer on the surface of the substrate, forming openings in the mask layer so as to be aligned generally with corresponding data/bit lines, depositing sidewall material in the openings of the mask layer, directionally etching the sidewall material so as to form sidewall structures arranged against inner surfaces of the openings and defining a generally centrally arranged hole in the sidewall structures, forming a plug structure in the holes, performing a directional etch with the plug structures as masking structures so as to define a plurality of pillars extending generally vertically from the surface of the substrate and substantially conforming to the contour and position of the plug structures, and forming gate structures about the pillars such that the gate structures substantially completely encompass corresponding pillars.

Thus, various embodiments provide a memory array including access transistors over buried data/bit lines which include substantially surrounding gate structures which provide improved sub-threshold performance and relatively high device density. Certain embodiments provide the ability to fabricate relatively precisely defined device features of sub-photolithographic dimensions. Embodiments also provide word lines that contact surround gate structures for improved control of the conduction channel. These and other objects and advantages of the invention will be more apparent from the following description taken in conjunction with the accompanying drawings.

BRIEF DESCRIPTION OF THE DRAWINGS

FIGS. 8A-11A are top views and FIGS. 8B-11B are side section views respectively of one embodiment of fabricating an ultra-thin body transistor;

FIGS. 12A-16A are top views and FIGS. 12B-16B are end section views respectively of another embodiment of fabricating an ultra-thin body transistor;

DETAILED DESCRIPTION OF THE PREFERRED EMBODIMENTS

Figure 1:
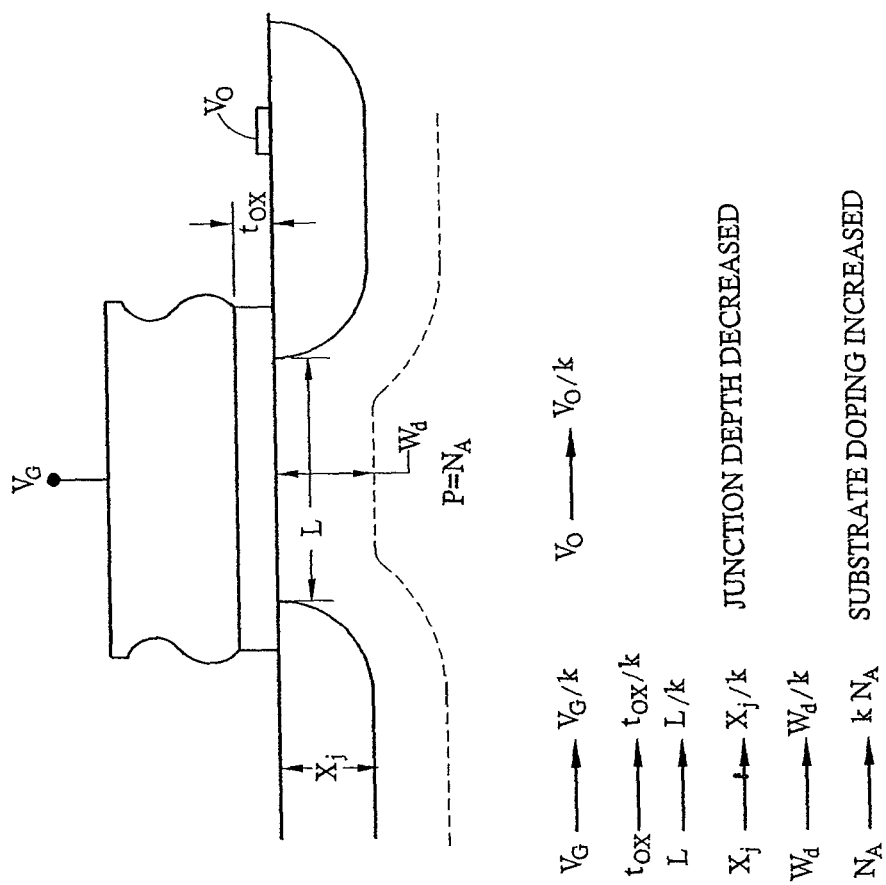
FIG. 1 is schematic illustration of general relationships of various device parameters/characteristics for a scaling factor k.
Figure 2:
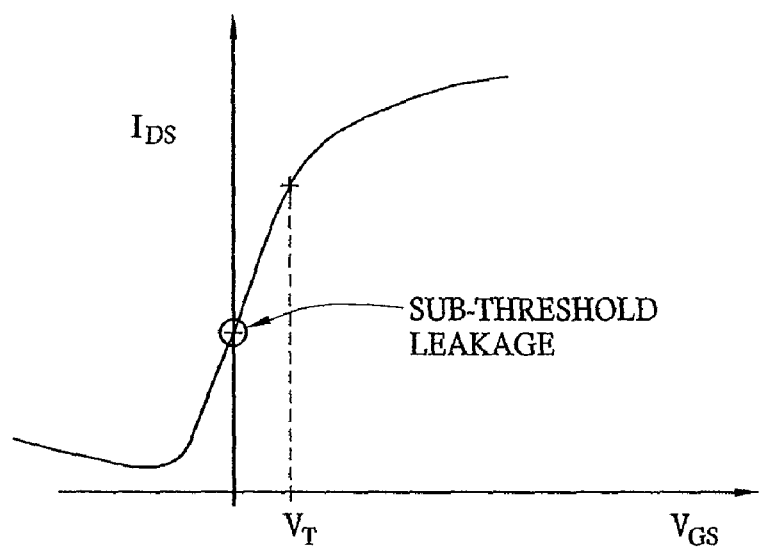
FIG. 2 is a graph illustrating sub-threshold leakage in a conventional silicon MOSFET.
Figure 3:
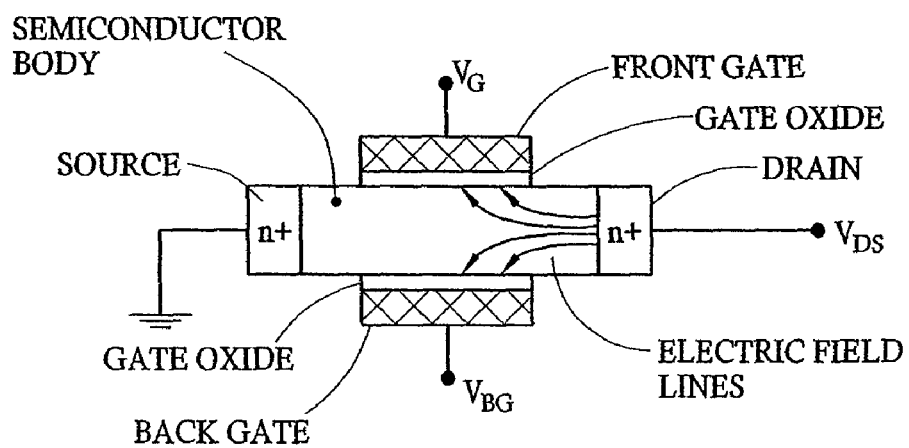
FIG. 3 is a schematic illustration of a known dual-gate MOSFET.
Figure 4:
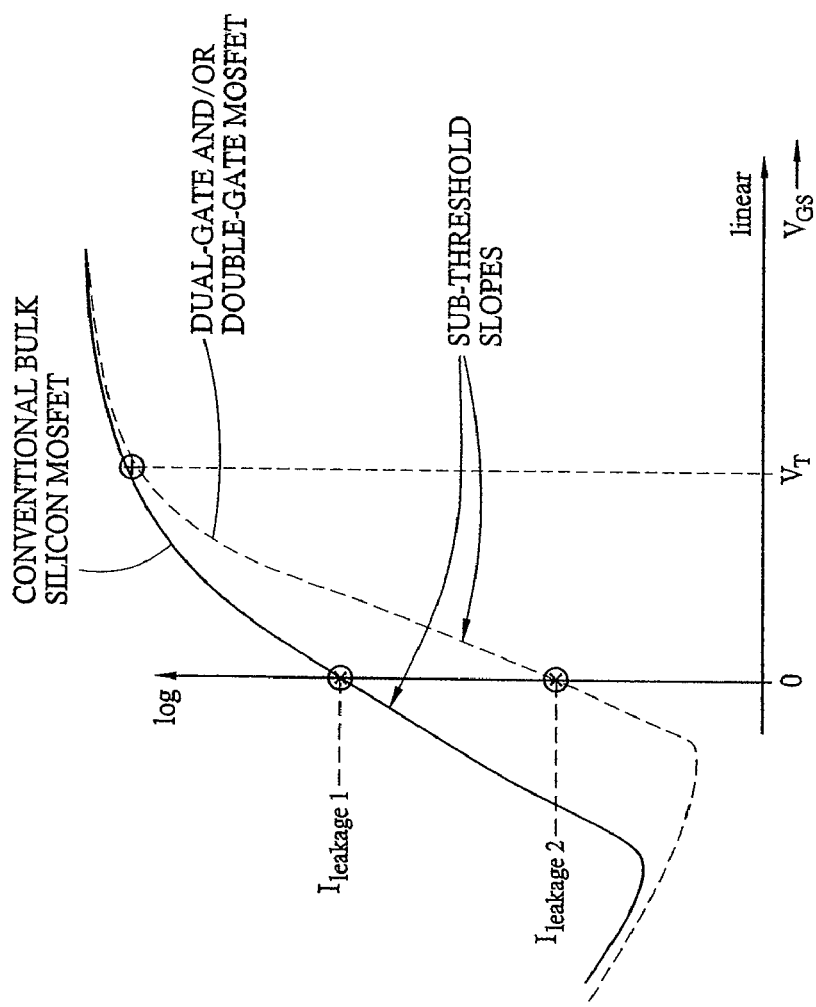
FIG. 4 is a graph illustrating sub-threshold conduction characteristics of conventional bulk silicon MOSFETs and of dual-gate and/or double gate MOSFETs.
Figure 5A:
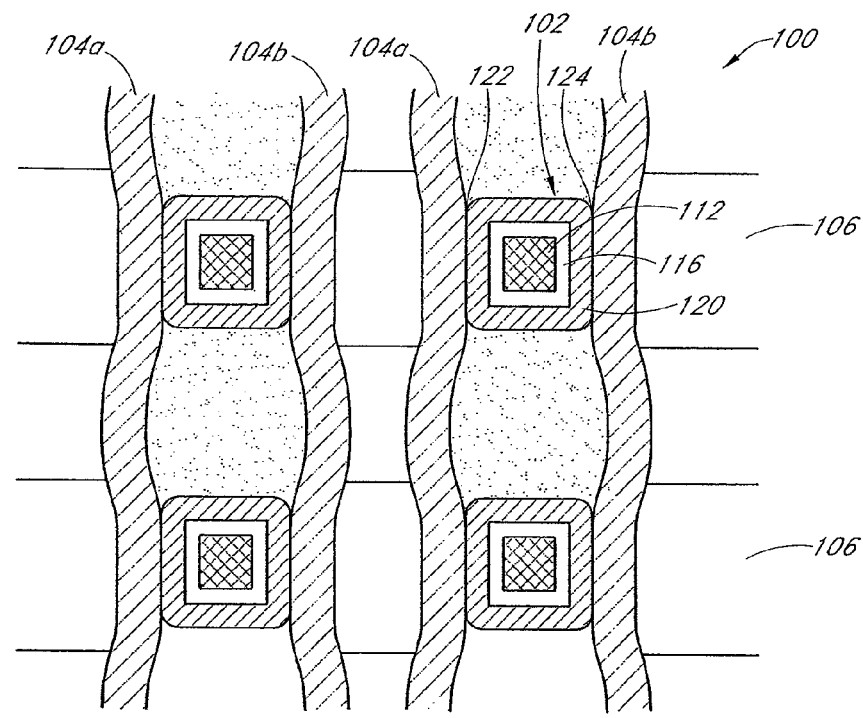
FIG. 5A is a top section view along A-A' of FIG. 5B which is a side section view both of one embodiment of an array of ultra-thin etched pillar access transistors.
Figure 5B:
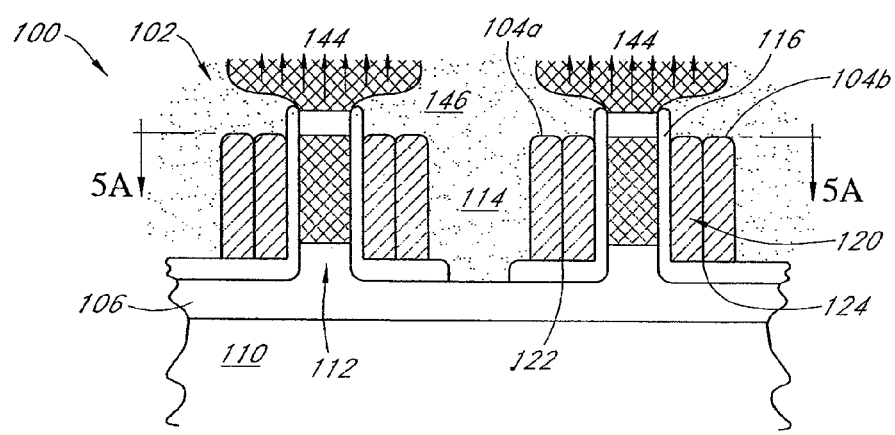
Figure 6:
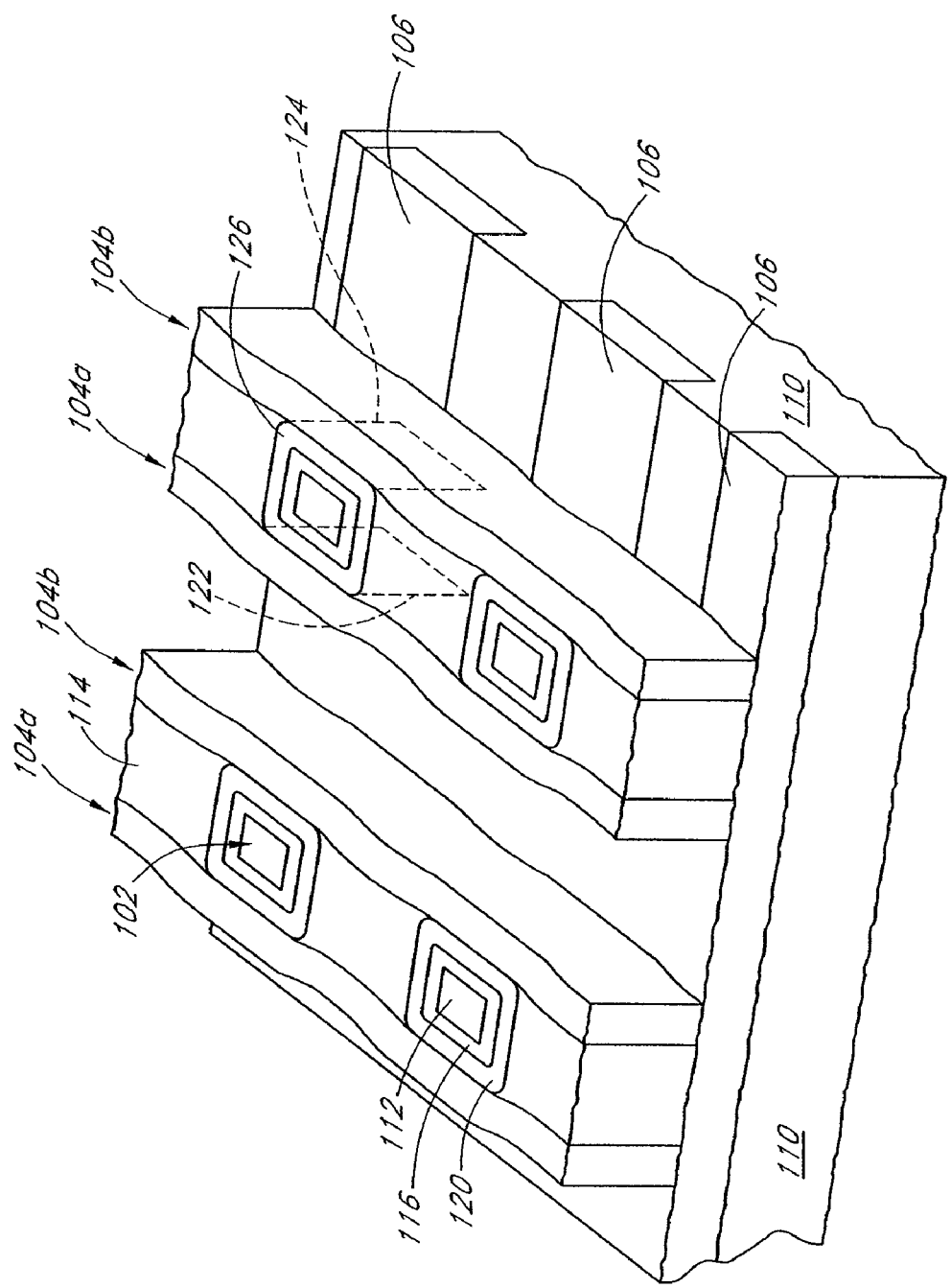
FIG. 6 is a perspective view of the embodiments shown in section in FIGS. 5A and 5B.

Reference will now be made to the drawings of the various embodiments of the invention wherein like reference numerals will refer to like parts/structures throughout. FIGS. 5A, 5B, and 6 illustrate a top section view, side section view, and perspective view respectively of one embodiment of a memory circuit access array 100, which in following will be referred to as the array 100 for brevity. The array 100 provides access with a plurality of memory cells, in certain embodiments an array of DRAM cells, which can be utilized for storage and access of information. The array 100 comprises a plurality of access transistors 102, each of which is in electrical communication with a corresponding word line 104 and data/bit line 106. In this particular embodiment of the array 100, the word lines 104 are arranged generally parallel to each other. The data/bit lines are as well arranged substantially in parallel with each other, and also extending generally transversely with respect to the word lines 104. In this particular embodiment, a pair of word lines 104a and 104b are provided for any given access transistor 102 and are arranged on opposite sides of each access transistor 102.

The array 100 is formed on top of a semiconductive substrate 110, in one particular embodiment comprising silicon. As can be seen in the side section view of FIG. 5B, the data/bit lines 106 extend across an upper surface of the substrate 110. In certain embodiments, the data/bit lines 106 comprise doped silicon regions of the substrate 110 and in one particular embodiment, n+ doped silicon. The array 100 also comprises a plurality of generally vertically extending ultra thin semiconductive pillars 112 forming a part of the structure of each access transistor 102 and positioned generally aligned with and atop corresponding buried data/bit lines 106. An insulator layer 114 is positioned atop the substrate 110 and interposed portions of the data/bit lines 106 and includes gate insulator regions 116 which, in this embodiment, extend generally upward and substantially circumferentially enclose or encompass each of the semiconductive pillars 112. Thus, the semiconductive pillars 112 are generally configured as ultra-thin vertically extending posts, cylinders, prisms, or the like, and the respective gate insulator regions 116 are configured as corresponding hollow posts, pillars, cylinders, prisms, or the like with the inner surface of the gate insulator region 116 conforming in cross-section to the outer surface of the respective semiconductive pillar 112 such that the two are in contact with each other.

Similarly, the array 100 comprises a corresponding plurality of gate conductor structures 120 which are also configured as generally vertically extending structures substantially encompassing or encircling and overlaid about the respective gate insulator region 116 with the enclosed semiconductive pillar 112. In one particular embodiment, the gate conductors 120 comprise polycrystalline silicon (polysilicon). The gate conductors 120 are arranged with respect to corresponding word lines 104a and 104b, such that the gate conductor 120 is in electrical contact with the respective word line 104a along a first contact surface 122, and such that the gate conductor 120 is in electrical contact with the respective word line 104b along a second contact surface 124 which is arranged substantially opposite the first contact surface 122.

Thus, as the word lines 104a and 104b comprise conductive material which is in electrical contact with the gate conductor 120, also comprising electrically conductive material, along the opposed first and second contact surfaces 122, 124, electrical potential which is provided via the word lines 104a, 104b will thus be conducted via the gate conductor 120 so as to substantially encompass or encircle the gate insulator region 116 and semiconductive pillar 112 which are arranged within the interior of the gate conductor 120. The electric potential/field within the pillars 112 will be substantially laterally or horizontally symmetric at a given vertical position of the pillar 112 (see FIGS. 7A and 7B). Thus, a surround gate structure 126 is defined wherein an electrical potential can be provided substantially encircling or encompassing the enclosed semiconductive pillar 112, however wherein the gate insulator region 116 inhibits electrical conduction therebetween.

This surround gate structure 126 (FIG. 6), by providing regulated electrical potential via the word lines 104a and 104b and further via the gate conductor 120 about substantially all lateral sides, faces, directions of the generally vertically extending semiconductive pillar 112, provides even more control of a gate potential applied to/removed from the pillar 112 as opposed to only a single side of a gate as in conventional bulk silicon processes and devices or the opposed sides of a dual gate and/or double gate MOSFET structure. In one embodiment, the doping of the pillars 112 is such that the transistors 102 operate from a substantially fully depleted state. Thus, in this embodiment, absence of an applied potential to the surround gate structure 126 substantially removes a conduction channel 134 (FIGS. 7A and 7B) thereby avoiding the need to apply a potential to turn off the transistors 102. This embodiment provides simplified and more convenient operation of the array 100 and facilitates integration with other systems.

Figure 7A:
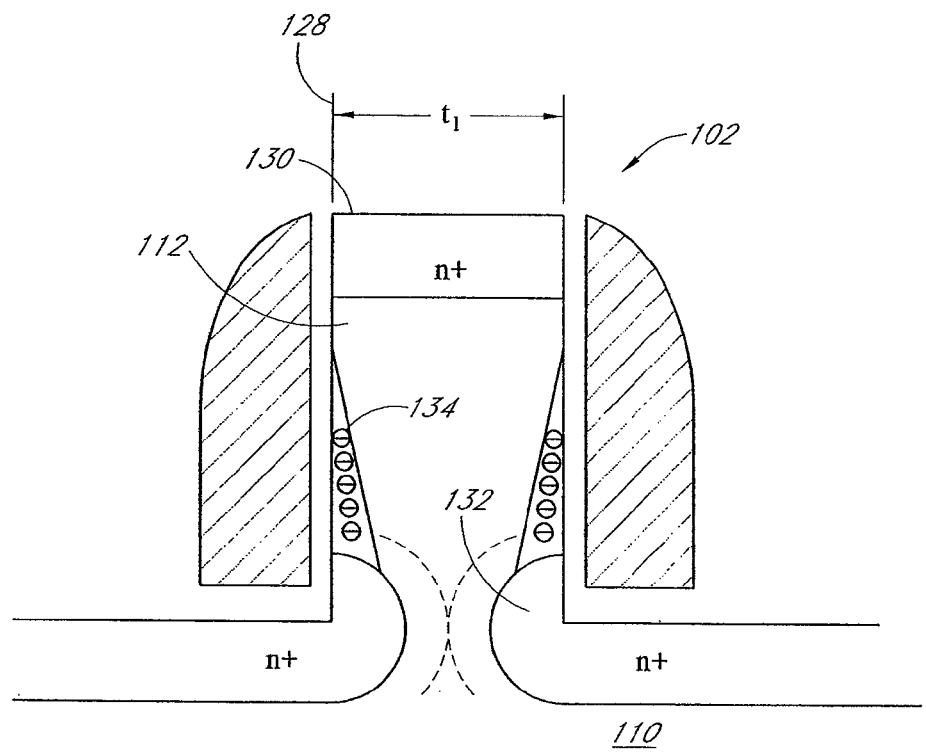
FIG. 7A is a side section view of one embodiment of an access transistor in a memory array and illustrating schematically electrical operation thereof.
Figure 7B:
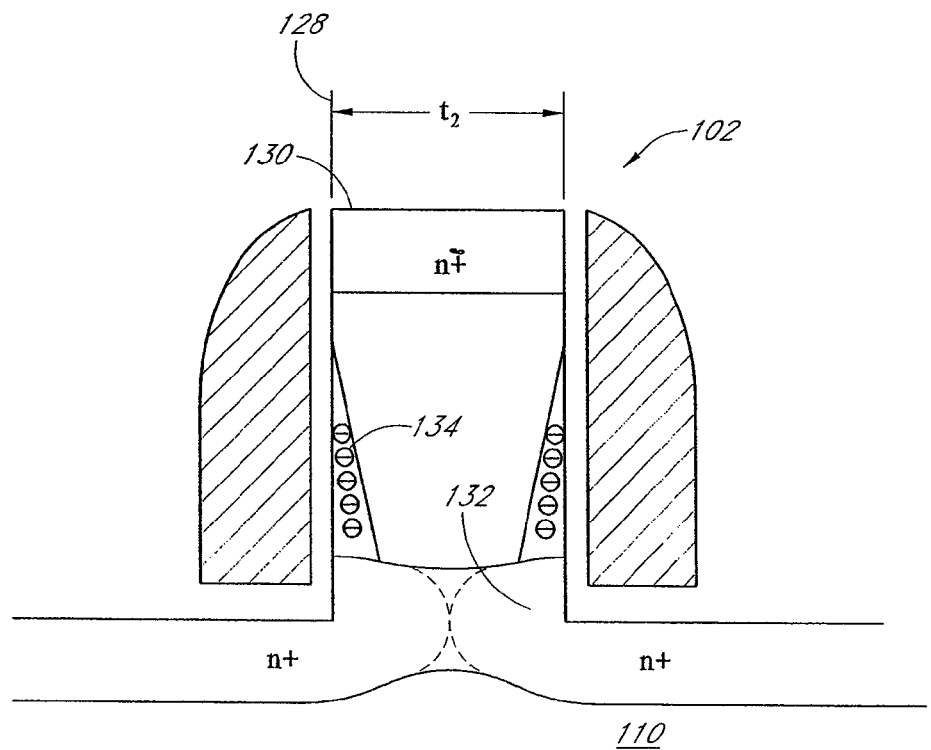
FIG. 7B is a side section view of another embodiment of an access transistor in a memory array and illustrating schematically electrical operation thereof.

FIGS. 7A and 7B illustrate in side section view in greater detail embodiments of portions of the array 100 including the access transistors 102 thereof. FIG. 7A illustrates one embodiment of the access transistor 102, wherein the pillar 112 has a thickness 128 indicated as $t_1$ and similarly for FIG. 7B the pillar 112 having a pillar thickness 128 $t_2$. While the illustrations herein are schematic in nature and should not be interpreted as being to scale, in these embodiments, the pillar thickness 128 $t_1$ is greater than the pillar thickness 128 $t_2$. It will be further appreciated that the pillar thickness 128 referred to can comprise multiple laterally-extending thickness measurements, such as in embodiments wherein the pillar 112 defines generally a rectangular prism structure, or generally a single lateral diameter dimension in embodiments wherein the pillar 112 defines generally a cylindrical vertically-extending structure.

In the embodiments illustrated in FIGS. 7A and 7B, drain regions 130 are defined generally adjacent the upper extent of the pillars 112 and source regions 132 positioned generally adjacent the lower extent of the pillars 112. In one particular embodiment, the drain region 130 and source region 132 comprise regions of the semiconductive pillar 112 which are doped n+. In these embodiments, when the access transistor 102 is in an off condition, the surround gate structure 126 will be at substantially a zero or a negative bias. In this case, the access transistor 102 of these embodiments offers better device characteristics than conventional bulk silicon MOSFETs. These improved device characteristics arise because the thin physical dimensions of the ultra-thin semiconductive pillars 112 facilitate full depletion of the transistor 102 with relatively low doping levels. In one embodiment, a major pillar thickness 128 of approximately 100 nm with doping density of approximately $1 \times 10^{15}/cm^3$ provides the transistor 102 with substantially full depletion characteristics. Thus, embodiments of the array 100 offer increased circuit density with individual transistors 102 having relatively low doping densities in the pillars 112 thereof which reduces the aforementioned problems with relatively high doping levels which would otherwise be indicated to mitigate short channel effects.

Further, because the surround gate structure 126 encloses all lateral sides of a conduction channel 134 rather than only on one side as in conventional MOSFETs or separate opposed sides as in a dual gate and/or double gate MOSFET, more effective control of the channel is provided. The conduction channels 134 of these embodiments will describe generally a vertically extending annulus or ring structure conforming generally to the cross-sectional contour of the corresponding semiconductive pillar 112. As previously noted, the conduction channels 134 are substantially horizontally symmetric at a given vertical position of the pillars 112. With the surrounding gate structure 126 combined with the ultra thin semiconductive pillar 112, electric field generated by the drain region 130 is better screened from the source region 132 at the opposite end of the conduction channel 134 region, thereby reducing subthreshold and standby leakage current therebetween. As previously indicated, this leakage current is a significant device parameter of the memory array 100, particularly when the array 100 is configured as an array of DRAMs. The subthreshold and leakage current is a significant variable in determining the maximum retention time and the corresponding requirements for refreshing of logic states stored in the array 100 and the corresponding time or intervals between required refresh operations.

During read and write operations to the various cells of the array 100, the surround gate structure 126 is biased positive to a value based on the particular application, however generally on the order of a few tenths of a volt. Depending upon the pillar thickness 128, as well as the implantation and diffusion parameters employed for the particular application of the array 100, the source region 132 may or may not substantially extend across the lower extent of the semiconductive pillar 112. Thus, in the embodiment of FIG. 7A, wherein the pillar thickness 128 is somewhat thicker as indicated by $t_1$, the source region 132 would not extend entirely across the lower extent of the semiconductive pillar 112. In contrast, in the embodiment illustrated by FIG. 7B, the pillar thickness 128 is relatively thinner or narrower indicated as $T_2$, and in this embodiment, the source region 132 would extend substantially across the bottom or lower extent of the semiconductive pillar 112. As the source region 132 of the embodiment illustrated in FIG. 7B extends across the base of the pillar 112 and thus provides a full p/n junction across the lower extent of the pillar 112, this embodiment is generally preferred. Because the pillar thickness 128 is relatively small, application of high temperature processes to induce lateral diffusion of implanted dopants to form the source regions 132 is reduced, thereby avoiding the problematic aspects of more extreme high temperature parameters such as would be required with wide pillar structures. For example, in one embodiment, the array 100 is formed with high temperature process parameters not exceeding approximately 800° C. and 10 minutes. Embodiments of fabrication of the array 100 will be described in greater detail below.

Figure 8A:
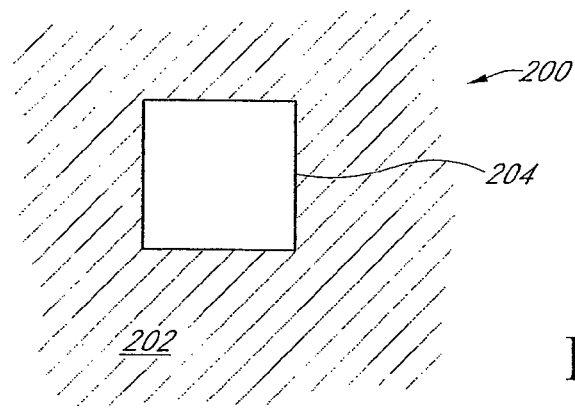
Figure 8B:
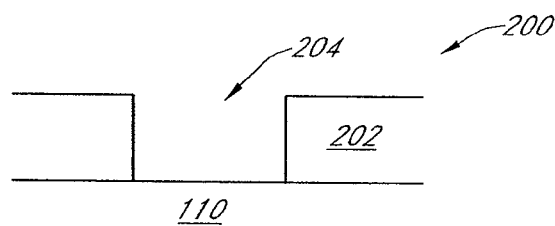
Figure 9A:
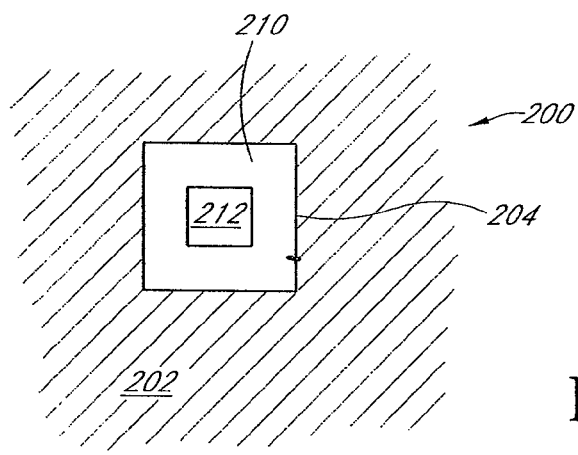
Figure 9B:
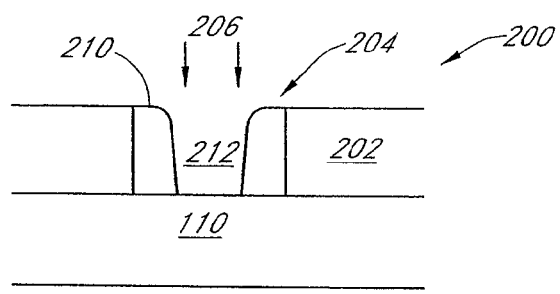
Figure 10A:
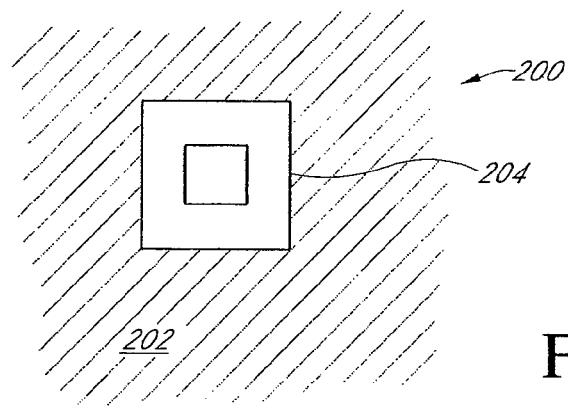
Figure 10B:
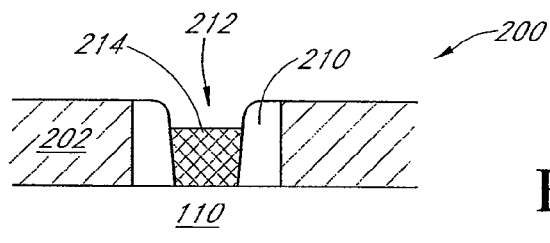

FIGS. 8A and 8B through 11A and 11B illustrate schematically one embodiment of methods 200 of forming ultra thin body transistors, such as the access transistors 102 previously described, wherein the transistors 102 have sub-lithographic dimensions. In this particular embodiment, the transistors 102 are formed by a side wall spacer technique described in greater detail below. As shown in FIGS. 8A and 8B, in top and side section views respectively, a mask material 202 is formed on top of the underlying substrate 110 and an opening 204 is formed in the mask layer 202 so as to expose a portion of the underlying substrate 110. The opening 204 is formed generally to conform to the desired cross-sectional shape of the surround gate structure 126 and semiconductive pillar 112. Thus, while a generally square-shaped opening 204 is illustrated, this is for ease of illustration and is only one of many possible shapes of the opening 204.

Following as shown in FIGS. 9A and 9B, again in top and side section views respectively, spacer material, in one embodiment comprising silicon oxide, is deposited within the opening 204 of the mask layer 202. This spacer material is subjected to an anisotropic etch 206 so as to form a sidewall spacer structure 210 positioned generally against inner surfaces of the opening 204 formed in the mask layer 202 and further so as to form a generally centrally positioned hole 212 generally in the center of the sidewall spacer structure 210 and the opening 204. Then as shown in FIGS. 10A and 10B, again in top and side section views respectively, a pillar plug 214 is formed within the generally centrally located hole 212 in the sidewall spacer structure 210. In one embodiment, the pillar plug 214 comprises silicon nitride which is deposited, planarized, and etched so as to partially recess the pillar plug 214 within the hole 212. This pillar plug 214 is subsequently utilized as a masking structure for etching of the underlying substrate 110 so as to define the semiconductive pillars 112. Thus, the profile and dimensions of the pillar plug 214 generally corresponds to the subsequently formed semiconductive pillars 112.

Figure 11A:
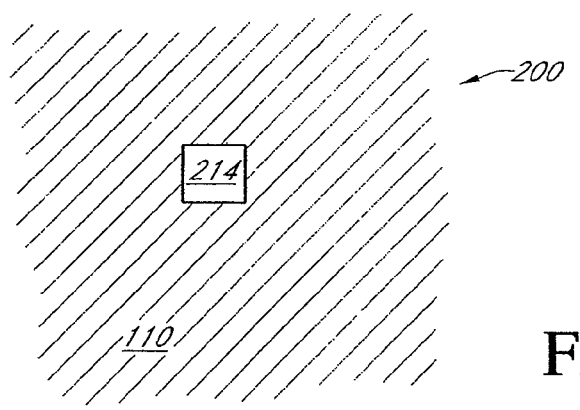
Figure 11B:
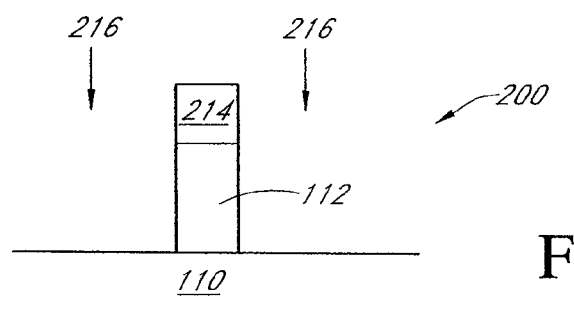

Then, as shown in FIGS. 11A and 11B, the mask 202 and side wall spacer structure 210 are removed so as to leave the pillar plug 214. An etch 216 is performed to remove portions of the upper surface of the substrate 110 with the pillar plug 214 as a masking structure. Thus, the vertically extending pillar 112 is defined extending upwards from the upper surface of the substrate 110.

FIGS. 12A-16A, 12B-16B, 17, and 18 illustrate steps of another embodiment of a method 300 for forming pillars 112 for the ultra thin body transistors 102. In this embodiment, a mask layer 302 is formed on top of the underlying substrate 110 and a generally elongate first mask opening 304 is formed therein. For ease of illustration and understanding, certain steps of the method 300 will be illustrated with respect to formation of a single semiconductive pillar 112, however, it will be understood that generally the method 300 would be employed to fabricate a plurality of the pillars 112 so as to subsequently define the array 100.

Figure 12A:
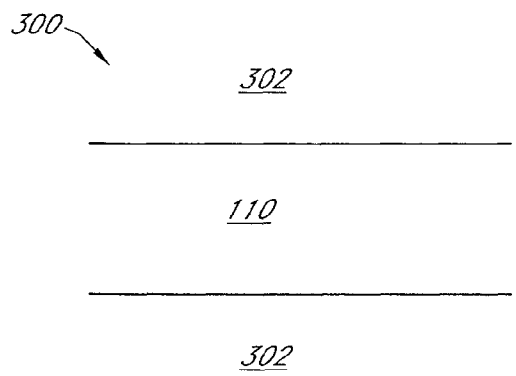
Figure 12B:
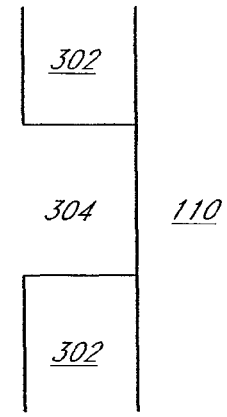
Figure 13A:
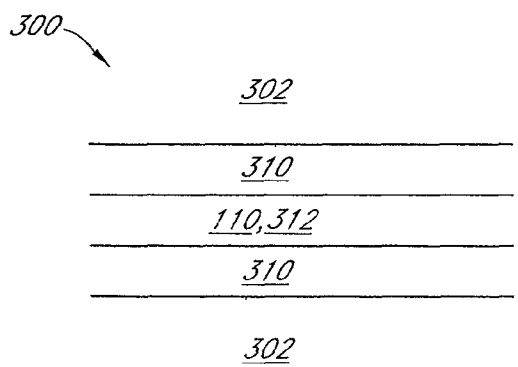
Figure 13B:
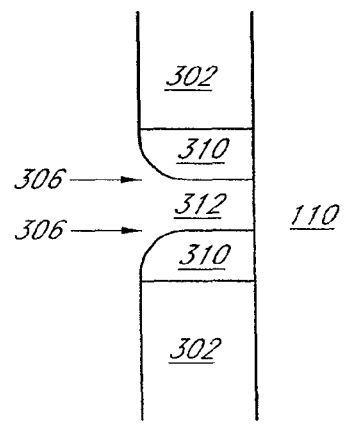
Figure 16A:
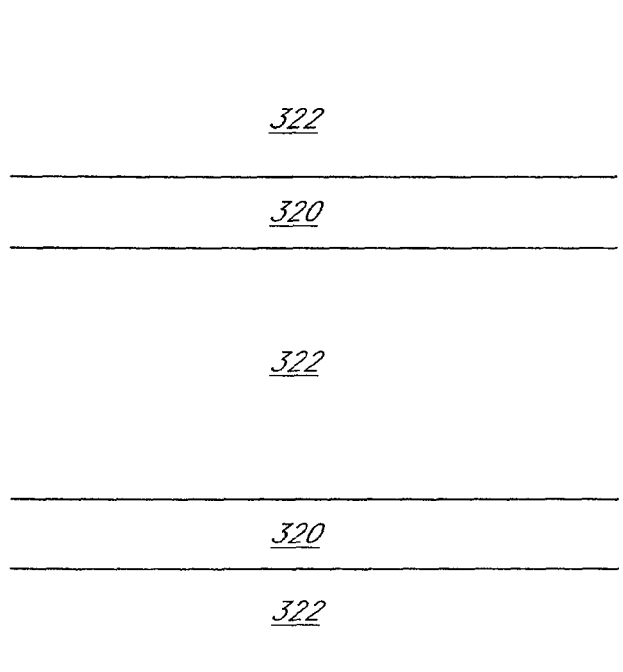
Figure 16B:
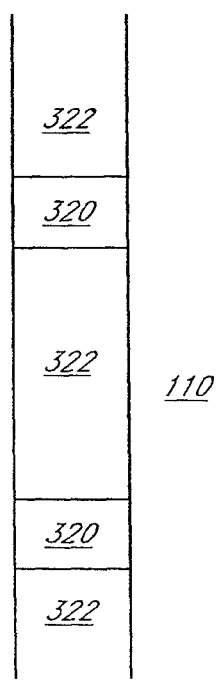

As shown in FIGS. 12A and 12B in top and end section view respectively, a first mask layer 302 is formed on the substrate 110 with a plurality of first openings 304 formed therein so as to expose generally parallel elongate trenchlike structures. Following as illustrated in FIGS. 13A and 13B, sidewall material is formed within the first opening 304 and exposed to an anisotropic etch 306 so as to define first sidewall spacers 310 which also extend in an elongate manner generally along the sides of the first opening 304 formed in the mask layer 302. The anisotropic etch 306 further defines a first central trench 312 which similarly extends in an elongate manner between opposed sidewall spacers 310.

As shown in FIGS. 14A and 14B in top and end section views respectively, a first plug strip 314 is formed within the first central trench 312 and in one particular embodiment comprises silicon nitride which is deposited, planarized, and etched so as to form the first plug strip 314 generally in a similar manner to that previously described for the pillar plug 214 of the method 200.

Following as illustrated in FIGS. 15A and 15B, again in top and end section views respectively, an etch 316 is performed employing the first plug strip 314 as a masking structure so as to define a plurality of underlying generally vertically extending pillar strips 320, which are elongate extending generally upward from the substrate 110 and corresponding generally to the contour and dimensions of the first plug strips 314. As further illustrated in FIGS. 16A and 16B, again in top and end section views respectively, the first plug strips 314 are removed, and the spaces between the first pillar strips 320 and above the substrate 110 are formed with a fill material 322 which, in one embodiment, comprises a back filling with silicon oxide.

Figure 17:
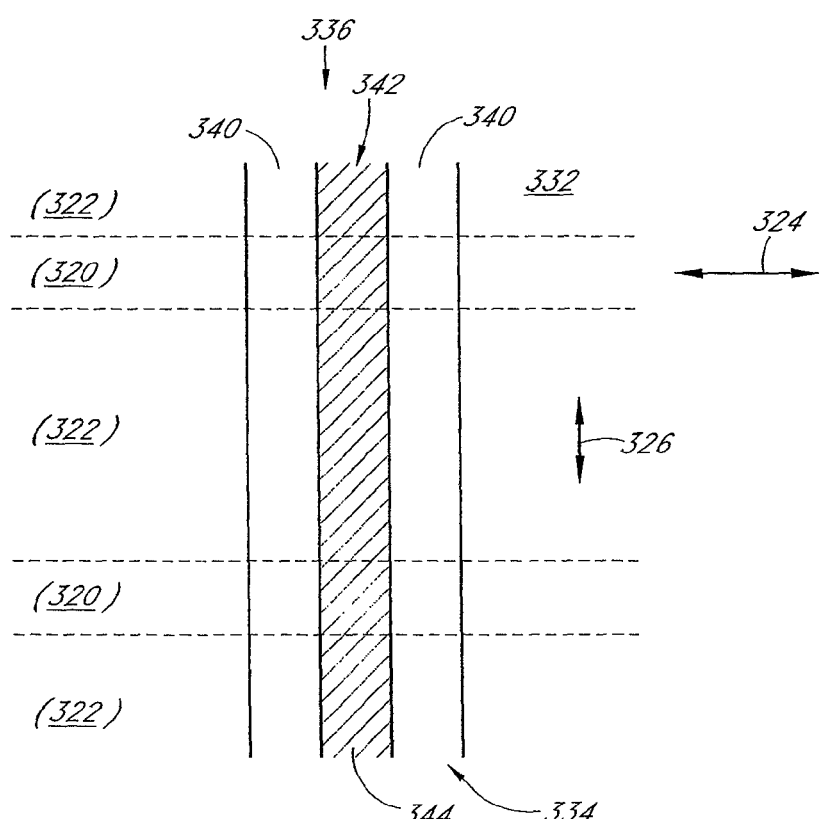
FIG. 17 is a top view of a further fabrication step in one embodiment of fabricating an ultra-thin body transistor.

Following as illustrated in FIG. 17 in top view, the preceding steps of the method 300 are repeated substantially as previously described, however with the difference that the structures previously described, such as the first pillar strips 320, are formed aligned generally along a first direction 322 and the following structures are fabricated oriented generally along a perpendicularly arranged second direction 326. Thus, as illustrated in FIG. 17, a second mask layer 332 is formed with a second opening 334 formed to extend generally in the second direction 326. These structures are formed to overly the previously formed pillar strips 320 and fill material 322 which are illustrated in dashed lines and with parenthetical reference numbers. Similarly, a sidewall material is formed within the second opening 334 and exposed to an anisotropic etch 336 so as to define second sidewall spacers 340 and a second central trench 342 positioned generally between the opposed sidewall spacers 340, again with these structures oriented generally in the second direction 326. The second central trench 342 is again filled with material so as to form a second plug strip 344, again extending generally along the second direction 326.

Figure 18:
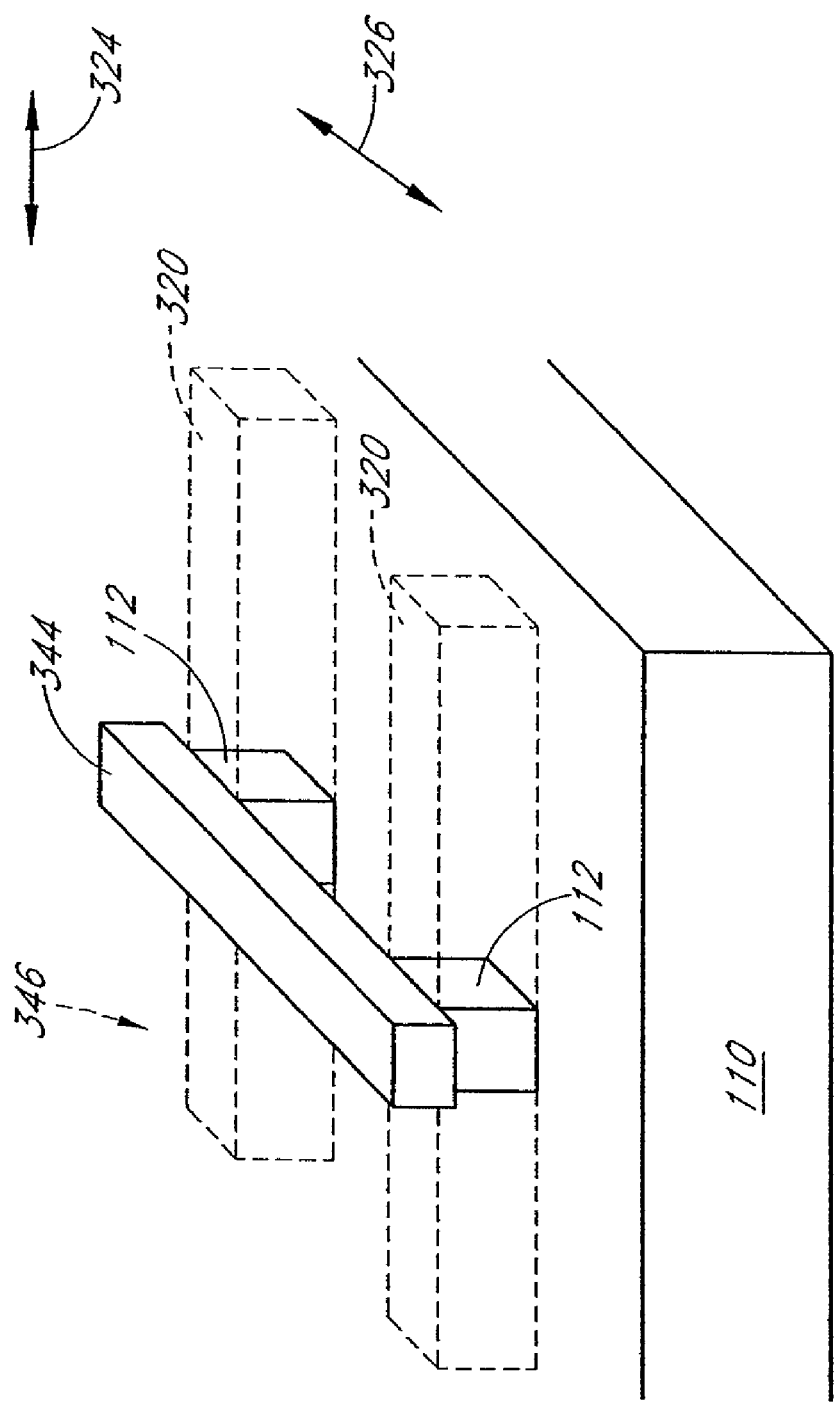
FIG. 18 is a perspective view of yet a further step in one embodiment of fabricating an ultra-thin body transistor.

Then as illustrated in perspective view in FIG. 18, an etch 346 is performed employing the second plug strip 344 as a masking structure. As the second plug strip 344 extends generally along the second direction 326 and overlies the previously formed pillar strips 320 extending generally in the first direction 324, the excess material of the first pillar strips 320 not masked by the intersecting second plug strip 344 is removed during the etch process 346 so as to define a corresponding plurality of generally vertically extending semiconductive pillars 112 extending generally vertically upward from the underlying substrate 110. Thus, in these embodiments, the size and configuration of the resultant semiconductive pillars 112 corresponds to the intersection envelope between the first plug strips 314 and second plug strips 344. In certain applications, the embodiments of the method 300 may provide advantages compared to the embodiments of the method 200 as the profile of the resultant semiconductive pillars 112 is defined by the intersection of the edges of the first plug strip 314 and second plug strip 344 which are configured as elongate strips rather than the single pillar plugs 214 of the method 200. In certain applications, edges may be more precisely defined than the contour of individual holes, such as the central hole 212.

Figure 19A:
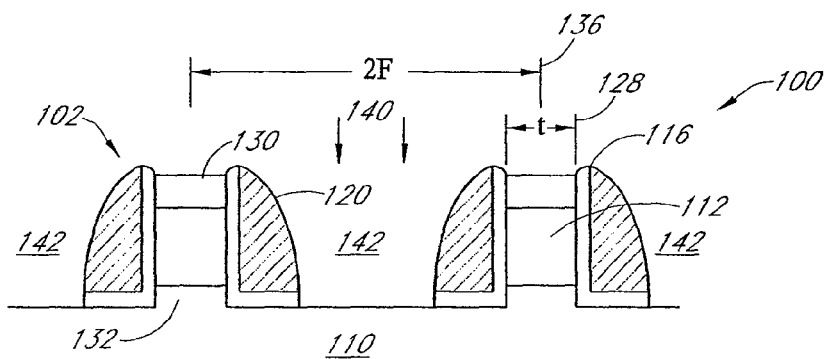
FIGS. 19A and 19B are side section and top views respectively of one embodiment of a method of forming surround gate structures.

FIGS. 19A, 19B, 20A, and 20B illustrate the further fabrication of the surround gate structures 126 and word lines 104 in this embodiment in a side wall spacer based process. As shown in FIG. 19A, the respective pillars 112 define a device to device spacing 136, separated by a distance 2F as shown. The pillars 112 also define a pillar thickness 128 indicated by t in FIG. 15. In these embodiments, the pillar thickness 128 is much less than the photolithographic dimension limit F, and thus the array 100 defines device features, such as the pillar thickness 128, which are below the photolithographic dimension F.

Figure 19B:
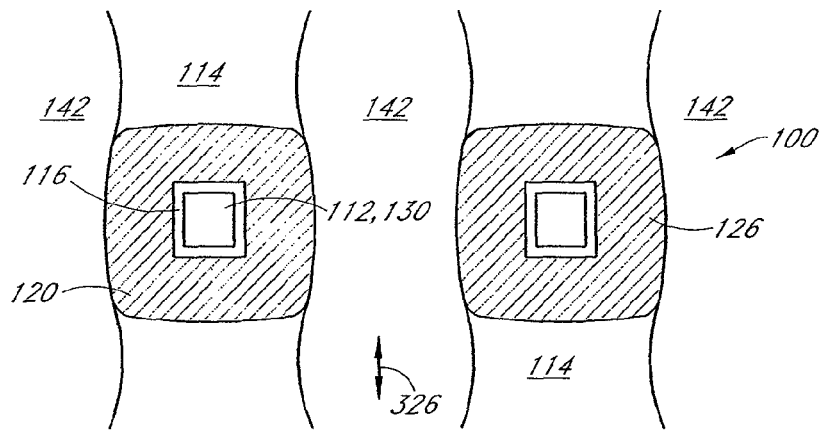

As shown in FIG. 19A, the gate insulator region 116 is grown or deposited and then polysilicon is further deposited on the gate insulator regions 116. An anisotropic etch 140 is then performed so as to define sidewall structures of the encompassing gate insulator region 116 and surrounding gate conductor 120. Then, as shown in FIG. 19B, in one embodiment, this structure is back filled, such as with the insulator layer 114 comprising oxide. Trenches 142 are formed in this back fill material, such as the insulator layer 114, wherein the trenches are interposed between adjacent transistors 102 and in one particular embodiment, extending generally in the second direction 326.

Figure 20A:
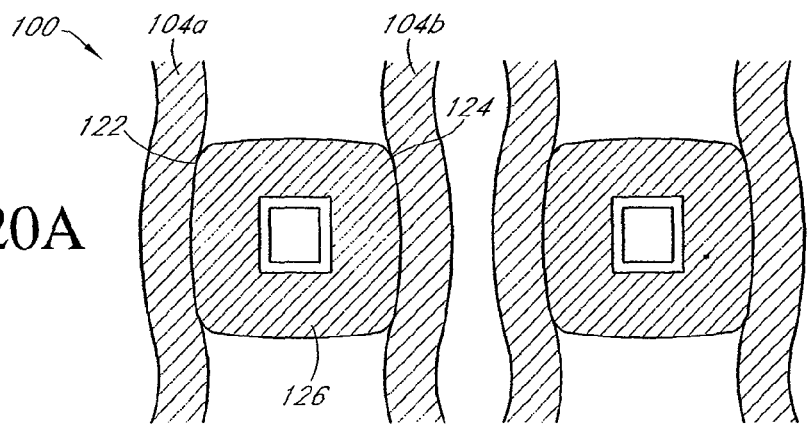
FIGS. 20A and 20B are side section and top views respectively of one embodiment of a method of forming word/address lines in enclosing contact with the surround gate structures.
Figure 20B:
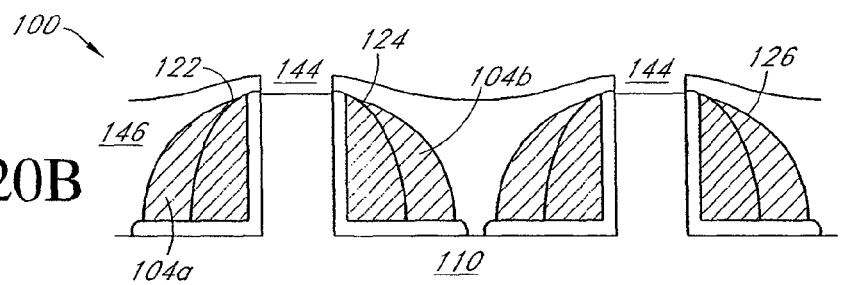

As shown in FIG. 20A, polysilicon or metal is deposited and anisotropically etched so as to be in contact generally at the first surface 122 and opposed second surface 124 defining the word/address lines 104a and 104b. The remainder of the process to form the array 100, for example, establishment of capacitor contacts 144 and formation of cap/passivation structures 146 as shown in FIG. 20B (also FIG. 5B) can be formed using conventional techniques well understood by one of ordinary skill in the art. It will also be understood that certain intermediate processes, such as implants/diffusion processes for example to dope the pillars 112 and form the drain 130 and source 132 regions to form the array 100 will also be well understood by one of ordinary skill.

Thus, the aforementioned embodiments describe methods 200 and 300 for forming an array 100 of memory cells, such as an array of DRAM cells, having access transistors 102 with semiconductive pillars 112 of ultra thin dimensions. In certain embodiments, the device dimensions, such as the pillar thickness 128, are much less than a photolithographic process limit F providing particularly efficient and densely packed components of the array 100. Further advantages of the embodiments described herein are the formation of a surround gate structure 126 which provides more effective control of the conduction channel 134 with the aggressive scaling provided by these embodiments. Furthermore, certain embodiments provide a substantially fully depleted pillar 112 structure of ultra-thin dimensions which reduces the need for extremely high doping levels to reduce short channel effects and the attendant problems of high doping levels.

Although the foregoing description of the preferred embodiment of the present invention has shown, described, and pointed out the fundamental novel features of the invention, it will be understood that various omissions, substitutions, and changes in the form of the detail of the apparatus as illustrated, as well as the uses thereof, may be made by those skilled in the art without departing from the spirit of the present invention.

What is claimed is:

1. A method of fabricating a memory array comprising:
   forming a plurality of conductive data/bit lines extending generally in a first direction in an upper surface of a semiconductive substrate;
   forming a plurality of access transistors extending generally upward from the upper surface of the substrate and aligned generally atop a corresponding data/bit line, wherein forming the access transistors comprises:
      forming a pillar extending generally upward from the upper surface of the substrate and generally aligned atop the corresponding data/bit line;
      forming a source region generally at a lower portion of the pillar so as to be in electrical communication with the corresponding data/bit line;
      forming a drain region generally at an upper portion of the pillar, wherein the pillar intermediate the source and drain regions is substantially fully depleted; and
      forming a gate structure substantially about the pillar in lateral directions such that the access transistors are substantially off with no applied gate potential; and
   forming a plurality of conductive word lines extending generally in a second direction and in electrical contact with a corresponding gate structure at at least a first surface thereof such that bias voltage applied to a given word line is communicated about the corresponding pillar via the gate structure.

2. The method of claim 1 further comprising heavily doping regions of the upper surface of the substrate.

3. The method of claim 1, wherein the pillar has a generally rectangular horizontal cross-section.

4. The method of claim 1 further comprising forming the source regions substantially across the lower portion of the pillar.

5. The method of claim 1 further comprising arranging the second direction generally perpendicular to the first direction such that the data/bit lines and word lines with the corresponding access transistors define a generally rectangular array.

6. The method of claim 5 further comprising configuring the upper portion of the pillars with the drain regions for electrical connection to external circuit components.

7. The method of claim 6 further comprising interconnecting the upper portions of the pillars to a corresponding plurality of storage capacitor contacts such that the array defines a dynamic random access memory (DRAM) array.

8. The method of claim 1 further comprising:
   associating a pair of conductive word lines with each corresponding access transistor; and
   arranging the pair of word lines such that a first word line contacts the corresponding gate structure at the first surface and a second word line contacts the corresponding gate structure at an opposed second surface.

9. The method of claim 1, wherein forming the gate structure comprises forming the gate structure substantially surrounding a portion of the pillar.

10. The method of claim 1, wherein forming the gate structure comprises forming the gate structure along the entire vertical extent of the pillar.

11. A method of fabricating a memory array comprising:
   forming a plurality of access transistors extending generally upward from an upper surface of a semiconductor substrate and aligned in association with a corresponding data/bit line, wherein forming the access transistors comprises:

forming a pillar;

forming a source region generally at a lower portion of the pillar so as to be in electrical communication with the corresponding data/bit line;

forming a drain region generally at an upper portion of the pillar, wherein at least a portion of the pillar intermediate the source and drain regions is depleted; and forming a gate structure substantially about the pillar such that the access transistors are substantially off with no applied gate potential; and forming a plurality of conductive word lines, each of the conductive word lines in electrical contact with a corresponding gate structure at least a first surface thereof such that bias voltage applied to a given word line is communicated about the corresponding pillar via the gate structure.

12. The method of claim 11 further comprising heavily doping regions of the upper surface of the substrate, wherein a plurality of data/bits lines comprise the heavily doped regions.

13. The method of claim 11, wherein the pillar has a generally rectangular horizontal cross-section.

14. The method of claim 11 further comprising forming the source regions so as to extend substantially across the lower portion of the pillar.

15. The method of claim 11 further comprising:
forming the data/bit lines in a first direction;
forming the plurality of conductive word lines in a second direction; and
arranging the second direction generally perpendicular to the first direction such that the data/bit lines and word lines with the corresponding access transistors define a generally rectangular array.

16. The method of claim 15 further comprising configuring the upper portion of the pillars with the drain regions for electrical connection to external circuit components.

17. The method of claim 16 further comprising interconnecting the upper portions of the pillars to a corresponding plurality of storage capacitor contacts such that the array defines a dynamic random access memory (DRAM) array.

18. The method of claim 11 further comprising:
associating a pair of conductive word lines with each corresponding access transistor; and
arranging the pair of word lines such that a first word line contacts the corresponding gate structure at the first surface and a second word line contacts the corresponding gate structure at an opposed second surface.

19. The method of claim 11, wherein forming the gate structure comprises forming the gate structure substantially surrounding a portion of the pillar.

20. The method of claim 11, wherein forming the gate structure comprises forming the gate structure along the entire vertical extent of the pillar.

* * * * *

UNITED STATES PATENT AND TRADEMARK OFFICE
CERTIFICATE OF CORRECTION

PATENT NO. : 8,227,305 B2  
APPLICATION NO. : 13/050819  
DATED : July 24, 2012  
INVENTOR(S) : Leonard Forbes It is certified that error appears in the above-identified patent and that said Letters Patent is hereby corrected as shown below:

On the Title page, in field (57), under "Abstract", in column 2, line 13, after "structure" insert -- at --.

In column 11, line 17, in Claim 11, after "structure" insert -- at --.

Signed and Sealed this
Second Day of October, 2012

David J. Kappos
*Director of the United States Patent and Trademark Office*